(12) United States Patent
Fudaba et al.

(10) Patent No.: US 6,717,464 B2
(45) Date of Patent: Apr. 6, 2004

(54) DISTORTION COMPENSATING APPARATUS

(75) Inventors: Nobukazu Fudaba, Kawasaki (JP);
Yasuyuki Oishi, Kawasaki (JP);
Tokuro Kubo, Kawasaki (JP); Kazuo Nagatani, Kawasaki (JP); Hajime Hamada, Kawasaki (JP); Hiroyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/256,833

(22) Filed: Sep. 27, 2002

(65) Prior Publication Data
US 2003/0184372 A1 Oct. 2, 2003

(30) Foreign Application Priority Data
Mar. 29, 2002 (JP) ........................................ 2002-095920

(51) Int. Cl.[7] .................................................. H03F 1/26
(52) U.S. Cl. ........................ 330/149; 330/136; 375/296
(58) Field of Search ................................. 330/149, 129, 330/136; 375/296

(56) References Cited

U.S. PATENT DOCUMENTS

| | | | | |
|---|---|---|---|---|
| 5,900,778 A | * | 5/1999 | Stonick et al. | 330/149 |
| 6,462,617 B1 | * | 10/2002 | Kim | 330/2 |
| 6,587,514 B1 | * | 7/2003 | Wright et al. | 375/296 |

* cited by examiner

Primary Examiner—Henry Choe
(74) Attorney, Agent, or Firm—Katten Muchin Zavis Rosenman

(57) ABSTRACT

In a distortion compensating apparatus for adaptively compensating a non-linear distortion of a circuit having the non-linear distortion, an adaptive equalizing processor adaptively selects, from among a filter coefficient group preliminarily held in a memory, a filter coefficient which makes an out-of-band power of an output signal reduced to be set in a digital filter.

26 Claims, 19 Drawing Sheets

FIG.15A
| LOOP FREQUENCY | COMPARED GRADIENT POSITION (DISTANCE FROM REFERENCE) N |
|---|---|
| 0 | 20 |
| 1 | 10 |
| 2 | 5 |
| 3 | 3 |
| 4 | 2 |
| 5 & MORE | 1 |
FIG.15B
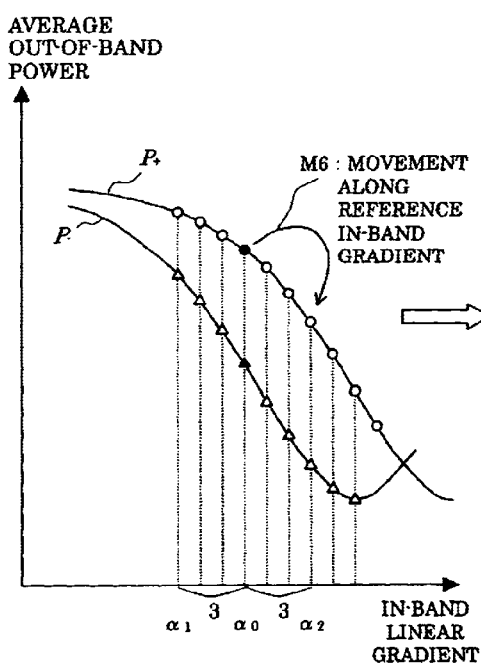
FIG.15C
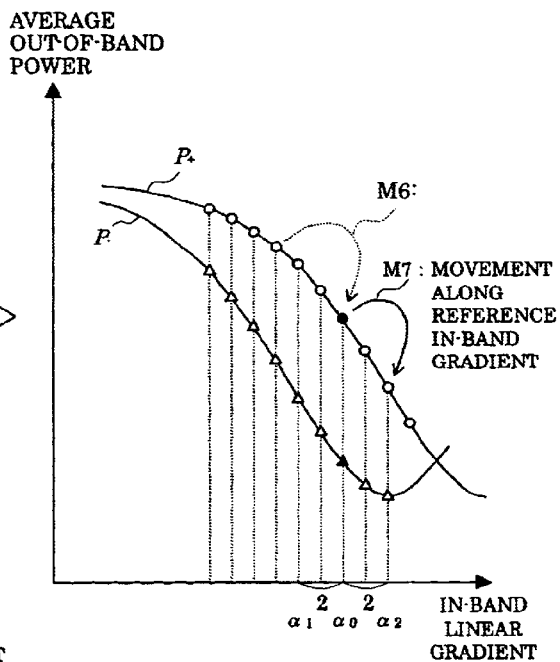

DISTORTION COMPENSATING APPARATUS

BACKGROUND OF THE INVENTION

1. Field of the Invention

The present invention relates to a distortion compensating apparatus, and in particular to a distortion compensating apparatus for adaptively compensating a non-linear characteristic of a circuit having a non-linear distortion.

Recently, a linear modulation method tends to be used for enhancing utilization efficiency of frequency which is a resource in a wireless communication including a mobile terminal. In this linear modulation method, a non-linear characteristic of an input/output power characteristic in a circuit having a non-linear distortion such as a power amplifier, and a low efficiency of power utilization caused thereby are the issues. In order to solve these issues, it is important to compensate the input/output characteristic of the power amplifier to provide a distortion-free linear characteristic.

2. Description of the Related Art

Various methods including a feed-forward type method have been proposed as a method of realizing a power amplifier having a linear characteristic, one of which is an adaptive predistorter type compensating method having a feedback loop.

FIG. 19A shows an adaptive predistorter type distortion compensating apparatus 110 for compensating a non-linear characteristic of a power amplifier 300 by a feedback loop. This adaptive distortion compensating apparatus 110 is composed of an adaptive distortion compensating algorithm processor 130 and a multiplier 120.

FIG. 19B shows an input/output power characteristic of the power amplifier 300, where a linear region A1 indicating a proportional characteristic between an input power and an output power, and a non-linear region (portion indicated by a solid line) A2 in which the output power approaches its saturation are shown.

The adaptive distortion compensating algorithm processor 130 operates an adaptive algorithm in order to minimize an error between a reference signal 500 which is an input signal 500 and a feedback signal 710 which is an output signal 600 of the power amplifier 300, and calculates a distortion compensating coefficient 720. The multiplier 120 provides to an input terminal of the power amplifier 300 a signal 510 obtained by multiplying the input signal 500 by the distortion compensating coefficient 720.

Namely, the distortion compensating apparatus 110 preliminarily multiplies the input signal 500 by the distortion compensating coefficient 720 to be provided to the power amplifier 300, thereby compensating the non-linear distortion of the power amplifier 300. As a result, the utilization efficiency of the power amplifier 300 is enhanced.

FIG. 19C shows an effect of a distortion compensation, where an abscissa indicates a frequency and an ordinate indicates an amplitude (radiant power or voltage). A frequency characteristic of a radiant power before the distortion compensation is shown by a solid line. Radiant powers B1 and B2 are generated in bands C1 and C3 outside a band C2 of an input signal. The radiant powers (dashed lines) of the bands C1 and C3 after the distortion compensation are reduced to powers B3 and B4.

In order to prevent the effect by the distortion compensation in such a prior art distortion compensating apparatus from being lost, it is necessary to reduce an influence by the frequency characteristic held by an analog circuit except the non-linear distortion. By means of an equalization with a filter having an inverse characteristic of the frequency characteristic of the analog circuit including the power amplifier 300, the influence can be reduced to a certain degree.

Although an adaptive equalizer is required since the characteristic of the analog circuit substantially varies with temperatures and aging, an adaptive equalizer suitable for the adaptive predistorter type distortion compensating apparatus has not been developed so far.

SUMMARY OF THE INVENTION

It is accordingly an objective of the present invention to provide a distortion compensating apparatus for adaptively compensating a non-linear characteristic of a circuit having a non-linear distortion, whereby a frequency characteristic of the non-linear distortion circuit is adaptively equalized and also a computing amount required for this equalization is reduced.

In order to achieve the above-mentioned objective, a distortion compensating apparatus according to the present invention comprises: an adaptive distortion compensator for controlling an input signal to a circuit with a non-linear distortion by an adaptive algorithm so as to reduce an error between a reference signal and a feedback signal from the non-linear distortion circuit, thereby compensating the non-linear distortion; a digital filter connected between the adaptive distortion compensator and the non-linear distortion circuit, or to a pre-stage of the adaptive distortion compensator; a memory for preliminarily holding a filter coefficient group set for the digital filter; and an adaptive equalizing processor for adaptively selecting, from among the filter coefficient group set, a filter coefficient which makes an out-of-band power of the feedback signal reduced (to be set in the digital filter). (claim 1)

Namely, an adaptive distortion compensator controls an input signal of a non-linear distortion power amplifier by an adaptive algorithm so as to reduce an error between a reference signal and a feedback signal from a non-linear distortion circuit (analog circuit), e.g. a non-linear power amplifier (hereinafter, a non-linear power amplifier is occasionally described as an example of a non-linear distortion circuit; also, a non-linear power amplifier represents one including an analog circuit such as a peripheral filter and a mixer), thereby compensating the non-linear distortion of the non-linear power amplifier.

An adaptive distortion compensator which has been proposed fits for this adaptive distortion compensator, and e.g. an adaptive predistorter type distortion compensating apparatus can be used for it.

A digital filter is connected either between the adaptive distortion compensator and the power amplifier in cascade, or to a pre-stage of the adaptive distortion compensator.

An adaptive equalizing processor adaptively selects, from among a filter coefficient group held in a memory, a filter coefficient which makes an out-of-band (radiant) power of the feedback signal reduced (to be set in a filter).

Thus, it becomes possible to adaptively equalize the frequency characteristic of the power amplifier. Also, by using the filter coefficient preliminarily held in the memory, the computing amount can be reduced.

Also, in the present invention according to the above-mentioned invention, the adaptive equalizing processor may comprise a Fourier transform operation processor for performing a Fourier transform to the feedback signal to output an amplitude spectrum of the feedback signal, and an adaptive equalizing algorithm processor for selecting, from among the filter coefficient group, a filter coefficient which makes the out-of-band power of the feedback signal reduced by the adaptive algorithm based on the amplitude spectrum (to be provided to the digital filter). (claim 2)

Namely, a Fourier transform operation processor, e.g. a Fast Fourier Transform (hereinafter, occasionally abbreviated as FFT or FFT transform) operation processor performs a fast Fourier transform to the feedback signal to output an amplitude spectrum (hereinafter, occasionally referred to as amplitude characteristic) of the feedback signal.

An adaptive equalizing algorithm processor selects, from among the filter coefficient group, a filter coefficient which makes the out-of-band power of the feedback signal reduced by the adaptive algorithm based on the amplitude spectrum (to be provided to the digital filter).

Thus, it is possible to adaptively equalize the frequency characteristic of the analog circuit by the digital signal processing.

Also, in the present invention according to the above-mentioned invention, the adaptive equalizing processor may comprise a band-pass filter which passes a signal of a predetermined band outside a band of the feedback signal, a detector for detecting an envelope of the predetermined band-pass signal, an AD converter for performing an analog/digital conversion to the detected signal, and an adaptive equalizing algorithm processor for selecting, from among the filter coefficient group, a filter coefficient which makes the out-of-band power reduced by an adaptive algorithm based on a digitally converted signal (to be provided to the digital filter). (claim 3)

Namely, a band-pass filter passes a signal of a predetermined band outside a band of the feedback signal. A detector detects an envelope of this passing signal, and an AD converter converts this detected signal into a digital signal.

An adaptive equalizing algorithm processor selects, from among the filter coefficient group, a filter coefficient which makes the out-of-band power reduced by an adaptive algorithm based on a digital signal (to be provided to the digital filter).

Thus, it is possible to pass the out-of-band signal of the non-linear distortion circuit (through the band), and to detect the signal in an analog region.

It is to be noted that the detector and the AD converter can be a power detecting IC or the like which directly measures a power value.

Also, in the present invention according to the above-mentioned invention, the filter coefficient group may comprise a row of filter coefficients for setting an in-band amplitude characteristic of the input signal of the digital filter to a predetermined in-band gradient. (claim 4)

Namely, the filter coefficient group may comprise a row of filter coefficients for setting an in-band amplitude characteristic of the input signal of the digital filter respectively to e.g. linear gradients −2 dB, −1 dB, 0 dB, +1 dB, and +2 dB.

Also, in the present invention according to the above-mentioned invention, the out-of-band power may comprise an average out-of-band power of a plurality of measured instantaneous out-of-band powers. (claim 5)

Also, in the present invention according to the above-mentioned invention, the adaptive equalizing processor may measure a radiant power in one or more predetermined out-of-band measurement regions as the out-of-band power. (claim 6)

Namely, the adaptive equalizing processor may assume a measurement region of the out-of-band power to be e.g. a predetermined band region within a higher frequency band than the band of the input signal, a predetermined band region within a lower frequency band, a predetermined band region within both frequency bands, or the like.

Thus, the adaptive equalizing processor can set the measurement region of the out-of-band power according to the frequency characteristic of the non-linear distortion circuit.

Also, in the present invention according to the above-mentioned invention, the adaptive equalizing processor may adaptively select a filter coefficient which nulls a difference in out-of-band powers between two measurement regions measured using the same filter coefficient respectively. (claim 7)

Also, in the present invention according to the above-mentioned invention, the adaptive equalizing processor may select a maximum value within out-of-band powers measured for each filter coefficient respectively in a plurality of the measurement regions, and may adaptively select a filter coefficient which minimizes the maximum value. (claim 8)

Also, in the present invention according to the above-mentioned invention, the adaptive equalizing processor may obtain a simple average of out-of-band powers measured for each filter coefficient respectively in a plurality of the measurement regions, and may adaptively select a filter coefficient which minimizes the average. (claim 9)

Also, in the present invention according to the above-mentioned invention, the adaptive equalizing processor may obtain a moving average of out-of-band powers measured for each filter coefficient respectively in a plurality of the measurement regions, and may adaptively select a filter coefficient which minimizes the average. (claim 10)

Also, in the present invention according to the above-mentioned invention, the adaptive equalizing processor may obtain a weighted average of out-of-band powers measured for each filter coefficient respectively in a plurality of the measurement regions, and may adaptively select a filter coefficient which minimizes the average. (claim 11)

Also, in the present invention according to the above-mentioned invention, the adaptive equalizing processor may adaptively converge a filter coefficient of a reference in-band gradient to a filter coefficient which minimizes an out-of-band power, by repeating that when signs of differences in out-of-band power, measured by a reference in-band gradient or one or more compared in-band gradients in each measurement region, between adjoining in-band gradients are same, a compared in-band gradient having a larger absolute value of a difference between both out-of-band powers is assumed to be a subsequent reference in-band gradient, and when the signs are different from each other, a compared in-band gradient having a smaller absolute value of a difference between both out-of-band powers is assumed to be a subsequent reference in-band gradient. (claim 12)

It is to be noted that in order to execute the present invention, a compared in-band gradient (in-band gradient to be compared) has only to be selected which makes the out-of-band power at the time when the filter coefficient of the compared in-band gradient is set in the digital filter smaller than the out-of-band power at the time when the filter coefficient of the reference in-band gradient is set in the digital filter.

Also, in the present invention according to the above-mentioned invention, the adaptive equalizing processor may change a distance on a row of filter coefficients between a filter coefficient having a reference in-band gradient and a filter coefficient having a compared in-band gradient, corresponding to a feedback number counted after a start of an algorithm. (claim 13)

Also, in the present invention according to the above-mentioned invention, the adaptive equalizing processor may change distance on a row of filter coefficients between a filter coefficient having a reference in-band gradient and a filter coefficient having a compared in-band gradient, corresponding to an average out-of-band power value when the filter coefficient having a reference in-band gradient is applied. (claim 14)

Also, in the present invention according to the above-mentioned invention, the adaptive distortion compensator may comprise an adaptive predistorter type distortion compensating apparatus, and the non-linear distortion circuit may comprise a power amplifier. (claims 15 and 16)

It is to be noted that this non-linear power amplifier includes an analog circuit such as an amplifier peripheral filter and a mixer.

BRIEF DESCRIPTION OF THE DRAWINGS

The above and other objectives and advantages of the invention will be apparent upon consideration of the following detailed description, taken in conjunction with the accompanying drawings, in which the reference numbers refer to like parts throughout and in which:

FIGS. 15A–15C are diagrams showing an example of an adaptive algorithm in an embodiment (8) of a distortion compensating apparatus according to the present invention;

DESCRIPTION OF THE EMBODIMENTS

[1] Embodiment (1)

Figure 1:
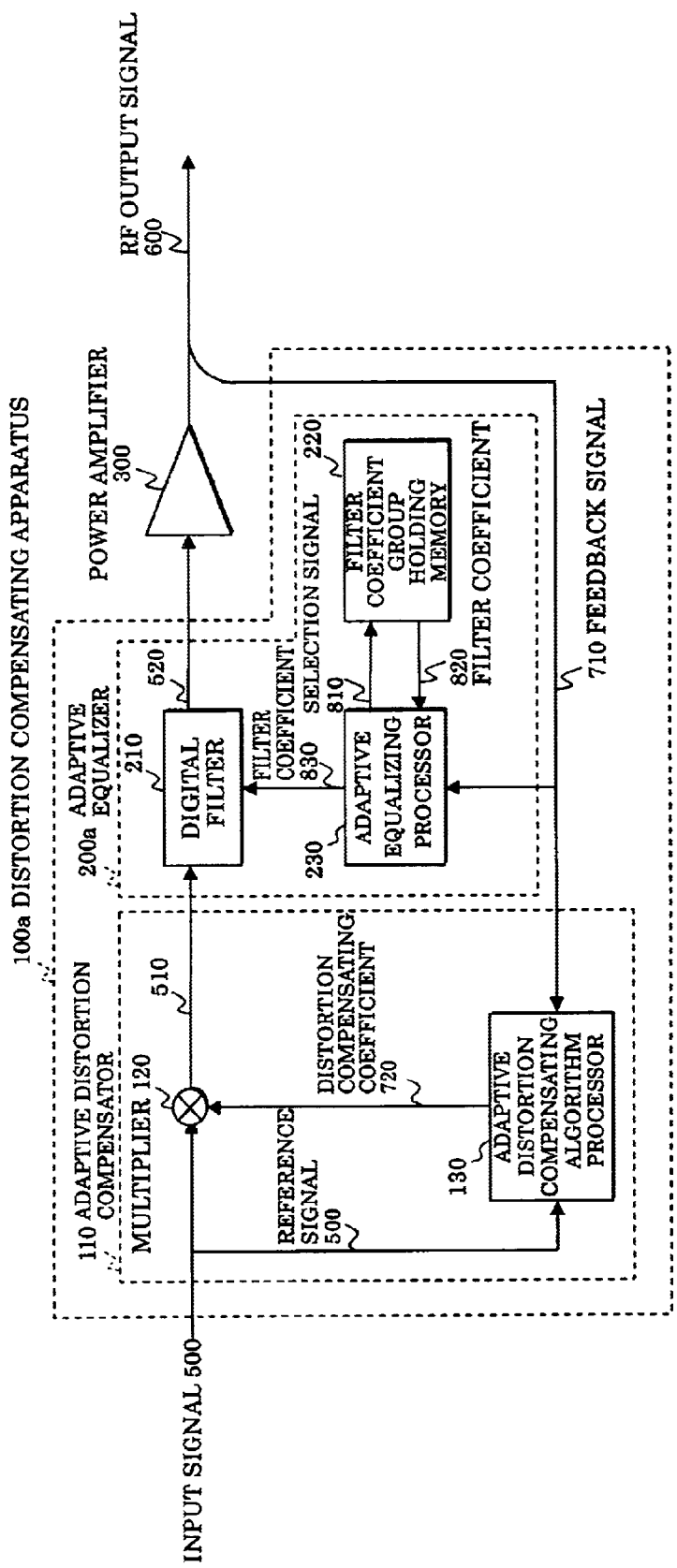
FIG. 1 is a block diagram showing an embodiment (1) of a distortion compensating apparatus according to the present invention.

FIG. 1 shows an embodiment (1) of a distortion compensating apparatus 100a according to the present invention, which is composed of an adaptive distortion compensator 110 and an adaptive equalizer 200a both arranged at a pre-stage of a power amplifier 300 which is a non-linear distortion circuit (analog circuit).

The adaptive distortion compensator 110 is e.g. an adaptive predistorter type distortion compensating apparatus, which is composed of an adaptive distortion compensating algorithm processor 130 for inputting a reference signal (input signal) 500 and a feedback signal 710 of a Radio Frequency output signal (hereinafter, occasionally referred to as RF output signal) 600 of the power amplifier 300 to perform an operation of a distortion compensating coefficient 720 for compensating a non-linear characteristic of the power amplifier 300 by an adaptive algorithm, and a complex multiplier 120 for outputting a signal 510 obtained by multiplying the input signal 500 by the distortion compensating coefficient 720.

It is to be noted that the adaptive algorithm of the adaptive distortion compensating algorithm processor 130 is not limited in the present invention, but a prior art adaptive algorithm may be applied.

The adaptive equalizer 200a is composed of a complex filter 210 for inputting the signal 510 to provide a signal 520 to the power amplifier 300, an adaptive equalizing processor 230 for determining a filter coefficient of the complex filter 210, and a filter coefficient group holding memory 220 for holding the filter coefficients of the complex filter 210.

The adaptive equalizing processor 230 obtains an average out-of-band power based on the feedback signal 710, and adaptively selects a filter coefficient which minimizes the average out-of-band power from among the filter coefficient group preliminarily held in the memory 220 to be set in the complex filter 210.

Thus, the filter coefficient group is preliminarily held in the memory 220, thereby enabling the computing amount, which matters in e.g. an equalizer or the like of an inverse characteristic operation type, to be reduced.

After a digital/analog conversion is performed to the output signal 520 of the complex filter 210 at a DA converter (not shown), the output signal 520 is transmitted as the RF output signal 600 through the power amplifier 300.

It is to be noted that while the adaptive equalizer 200a is arranged between the adaptive distortion compensator 110 and the power amplifier 300 in this embodiment (1), the adaptive equalizer 200a may be arranged at the pre-stage of the adaptive distortion compensator 110.

Figure 2:
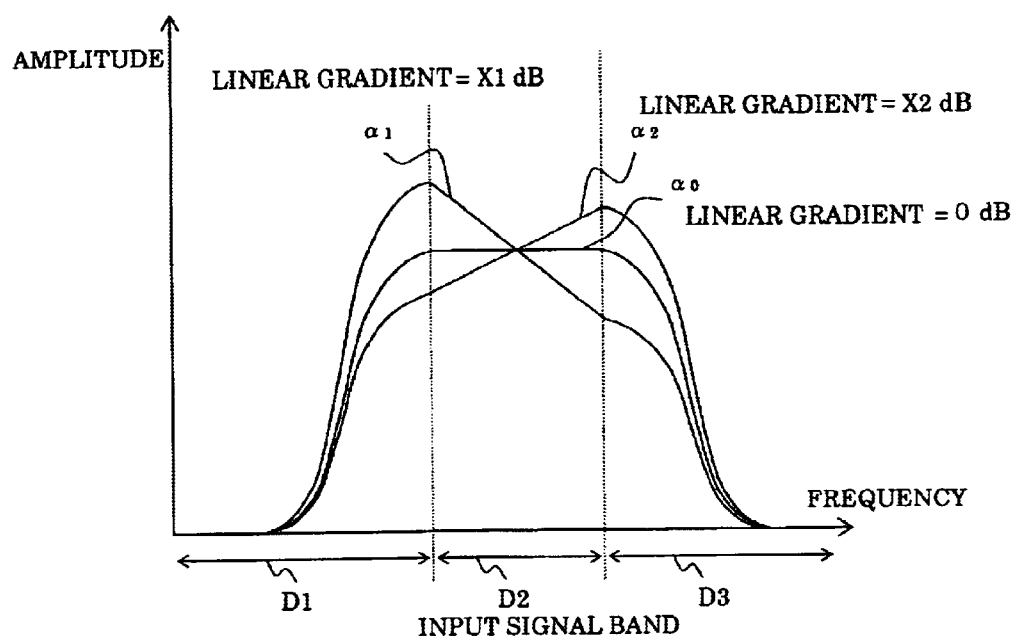
FIG. 2 is a diagram showing an amplitude characteristic example of a digital filter in a distortion compensating apparatus according to the present invention.

FIG. 2 shows an amplitude characteristic example of the filter 210 set by the filter coefficient group held by the memory 220. This example especially shows amplitude characteristic examples of three filters having an amplitude characteristic for correcting a linear amplitude deviation.

Namely, FIG. 2 shows an amplitude characteristic example of a filter without a linear gradient (i.e. having a fixed gradient $\alpha_0$), a filter having a linear gradient $\alpha_1$ of X1 dB, and a filter having a linear gradient $\alpha_2$ of X2 dB within a band D2 of the input signal 500.

The amplitude characteristics of these filters outside the band (in bands D1 and D3) go along a gentle curve such as a raised cosine. These filters are preliminarily designed, and the filter coefficients are held in the memory 220.

The region (X1–X2 dB) of the in-band gradient of the amplitude, and a gradient step size ($\Delta$ dB) indicating a gradient variation range are determined corresponding to a memory capacity to be used, a variation amount of a frequency characteristic of the non-linear distortion circuit (power amplifier), or the like. When the gradient region is –2 to +2 dB, and the gradient step size $\Delta$=0.05 dB for example, the number of filter coefficients held in the memory 220 are 81 (=(|X1|+|X2|)/$\Delta$+1).

When the frequency characteristic of the non-linear distortion circuit is equalized by the filter, the average out-of-band power obtained from the feedback signal 710 is minimized. Accordingly, by selecting a filter coefficient which minimizes the average out-of-band power from among the filter coefficient group, the amplitude deviation held by the non-linear distortion circuit can be approximately equalized.

Figure 3:
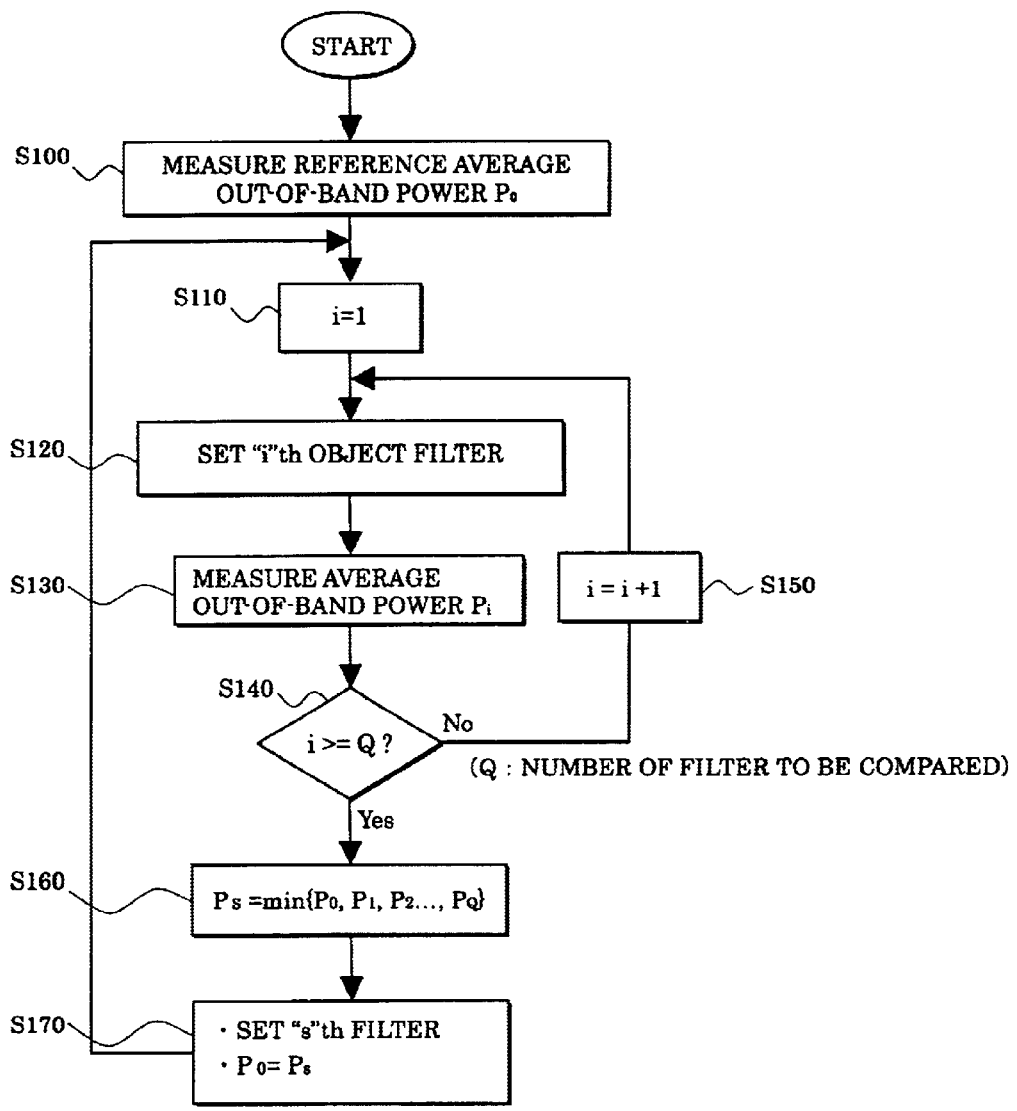
FIG. 3 is a flow chart showing an operation procedure in an embodiment (1) of a distortion compensating apparatus according to the present invention.

FIG. 3 shows an operation procedure of the adaptive equalizing processor 230 in the adaptive equalizer 200a shown in FIG. 1, which will now be described.

Step S100: The adaptive equalizing processor 230 provides a selection signal 810 to the memory 220, and selects a filter coefficient 820 corresponding to e.g. the in-band gradient $\alpha_0$ which assumes a reference to be set in the filter 210 as a filter coefficient 830.

Then, the adaptive equalizing processor 230 measures a reference average out-of-band power $P_0$ of the feedback signal 710.

Steps S110 and S120: The adaptive equalizing processor 230 initializes "i" to "1", and determines filter coefficients of Q in-band gradients $\alpha_1$-$\alpha_Q$, which form comparison objects of a reference in-band gradient $\alpha_0$, from among the filter coefficient group held in the filter coefficient group holding memory 220. Then, the adaptive equalizing processor 230 selects the first (="i"th) filter coefficient among them to be set in the filter 210.

Step S130: The adaptive equalizing processor 230 measures an average out-of-band power $P_1$ of the feedback signal 710.

Loop of steps S140, S150, S120, and S130: The adaptive equalizing processor 230 sequentially executes i=i+1, and selects the 2nd, 3rd, . . . , Qth filter coefficients to measure average out-of-band powers $P_2$–$P_Q$ corresponding to the filter 210.

Steps S140 and S160: After measuring the Qth average out-of-band power, the adaptive equalizing processor 230 executes $P_s$=min [$P_0, P_1, \ldots, P_Q$], and obtains the minimum average out-of-band power $P_s$ from among the average out-of-band powers $P_0$–$P_Q$.

Step S170: The adaptive equalizing processor 230 sets the "s"th filter coefficient minimizing the average out-of-band power in the filter 210, assumes $P_0=P_s$, and sets the "s"th in-band gradient $\alpha_s$ to a new reference in-band gradient $\alpha_0$ Thereafter, the adaptive equalizing processor 230 returns to step S110, and the same operation is repeated to a new reference in-band gradient $\alpha_0$ and new in-band gradients $\alpha_1$-$\alpha_Q$ which form the comparison objects of the reference in-band gradient $\alpha_0$.

Thus, the filter coefficient of the reference in-band gradient $\alpha_0$ converges to the filter coefficient minimizing the average out-of-band power. In this way, it becomes possible to adaptively equalize the frequency characteristic of the analog portion.

[2] Embodiment (2)

Figure 4:
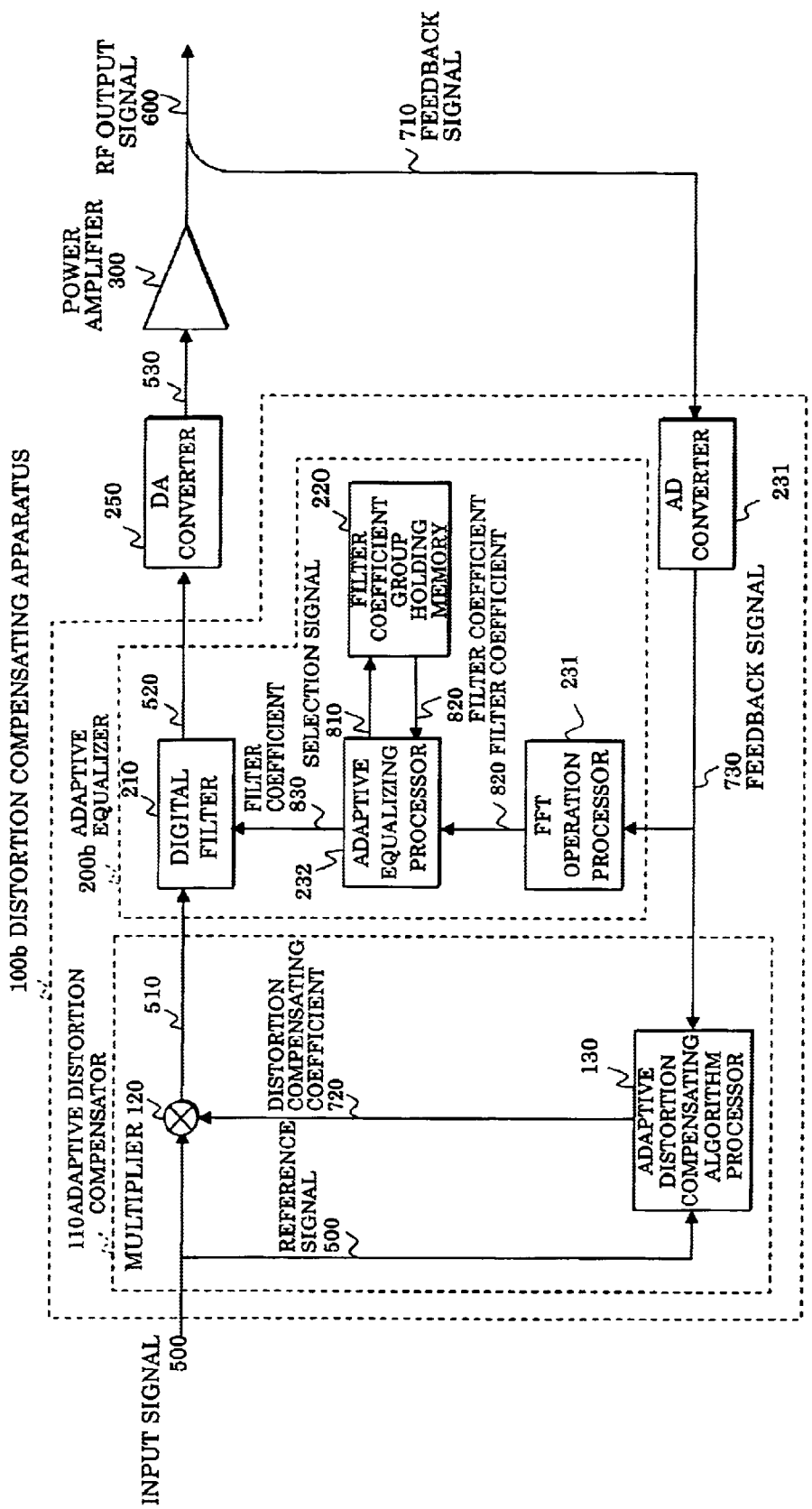
FIG. 4 is a block diagram showing an embodiment (2) of a distortion compensating apparatus according to the present invention.

FIG. 4 shows an embodiment (2) of a distortion compensating apparatus 100b according to the present invention. This embodiment (2) shows a case where the measurement of the average out-of-band power in the adaptive equalizing processor 230 shown in the embodiment (1) is performed by a fast Fourier transform.

The embodiment (2) is different from the embodiment (1) in that the adaptive equalizing processor 230 of the embodiment (1) is composed of an FFT operation processor 231 and an adaptive equalizing algorithm processor 232. Also, a DA converter 250 and an AD converter 260 omitted in the embodiment (1) are shown in FIG. 4.

In operation, the AD converter 260 provides to the FFT operation processor 231 a digital feedback signal 730 obtained by performing an AD conversion to the feedback signal 710. The FFT operation processor 231 performs a K-point fast Fourier transform to the feedback signal 730, and provides the obtained amplitude characteristic (amplitude spectrum) to the adaptive equalizing algorithm processor 232.

Figure 5:
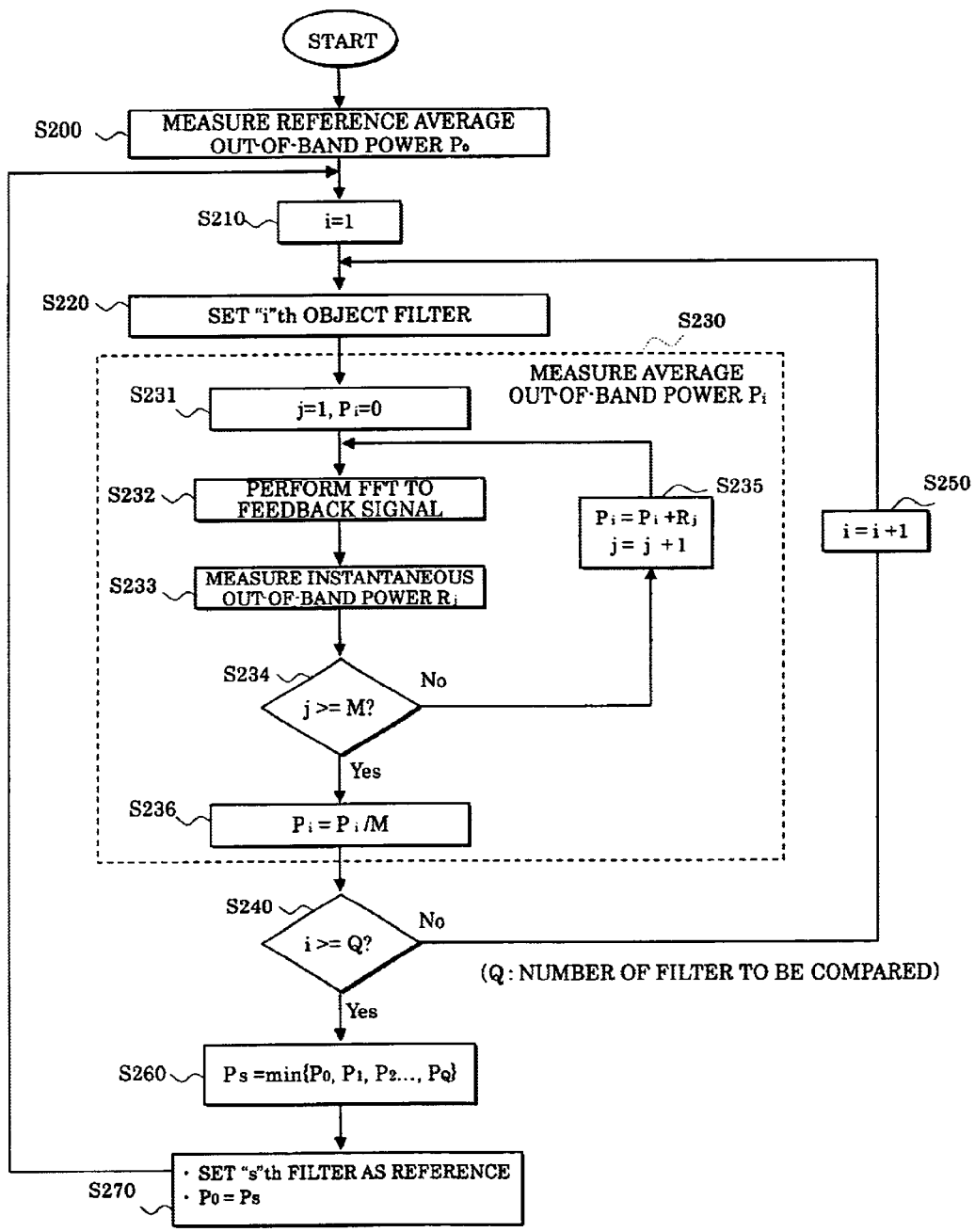
FIG. 5 is a flow chart showing an operation procedure in an embodiment (2) of a distortion compensating apparatus according to the present invention.

FIG. 5 shows an operation procedure of the FFT operation processor 231 and the adaptive equalizing algorithm processor 232. This operation will now be described.

Step S200: The processor 232 sets the filter coefficient of the reference in-band gradient in the filter 210. The FFT operation processor 231 performs the FFT transform to the feedback signal 730 to provide the amplitude characteristic to the processor 232. The processor 232 performs the operation of the reference average out-of-band power $P_0$ from an instantaneous out-of-band power measured e.g. M times.

Steps S210 and S220: The processor 232 sets i=1, and sets the 1st filter coefficient read from the filter coefficient group holding memory 220 in the filter 210.

Step S230: The processor 232 measures the instantaneous out-of-band power M times and obtains the average out-of-band power $P_1$ of the measured results. This step S230 is composed of following steps S231–S236.

Steps S231 and S232: The processor 232 sets j=1 and $P_1$=0. The FFT operation processor 231 performs the FFT transform to the feedback signal 730 to provide an amplitude characteristic 840 to the processor 232 (see FIG. 4).

Figure 6:
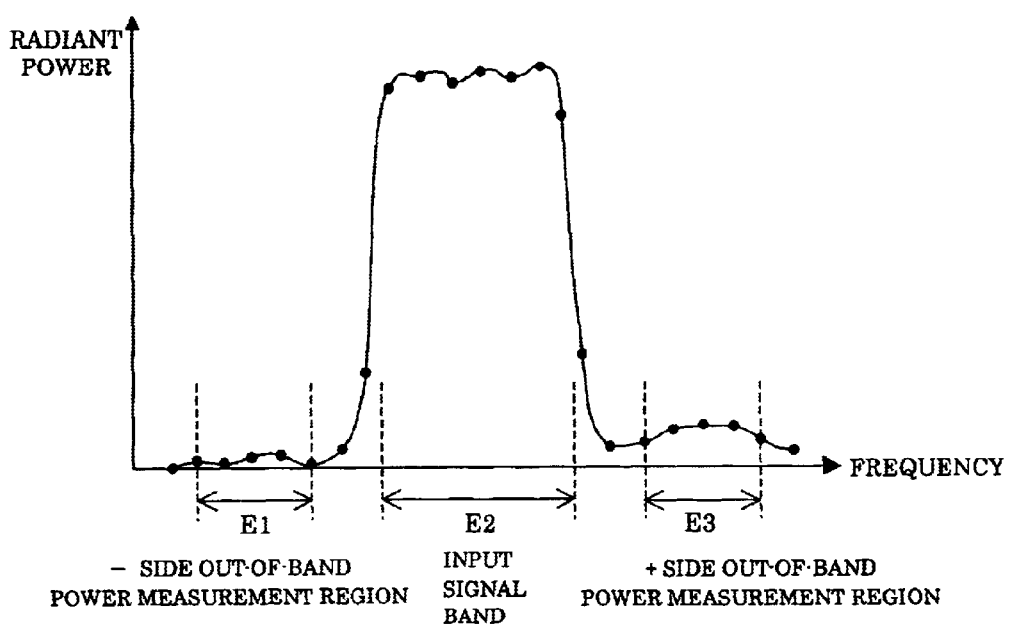
FIG. 6 is a diagram showing a measurement example of an out-of-band power in a distortion compensating apparatus according to the present invention.

FIG. 6 shows an instantaneous out-of-band power to which the operation has been performed by the processor 232 based on the amplitude characteristic measured by the FFT operation processor 231. This radiant power exists in a lower frequency band and a higher frequency band compared with a carrier band E2 of the input signal (or output signal). Hereinafter, the higher frequency band is referred to as a + side band, and the lower frequency band is referred to as a − side band.

The measurement region of the out-of-band power may be a predetermined band E3 within the + side band, a predetermined band E1 within the − side band, or both of the bands E1 and E3.

Step S233: The processor 232 measures an instantaneous out-of-band power $R_1$ from the amplitude characteristic 840.

The point number K of the FFT transform depends on a used memory amount of the processor 231, and when K is relatively small (e.g. K=128, 256, etc.), the accuracy of the instantaneous out-of-band power obtained from a single FFT is lowered. Therefore, the K-point FFT transform is repeated M times, and the average out-of-band power of the instantaneous out-of-band powers is used. The repetition number M, which depends on the point number of the FFT, is experimentally obtained.

The operation for obtaining the average out-of-band power $P_1$ corresponding to the filter 210 in which the 1st filter coefficient is set will now be described.

Steps S234 and S235: Since j (=1)<M (repetition frequency), $P_1=P_1+R_1$ and j=j+1 are executed. Then, the process returns to step S232.

Loop of steps S232, S233, S234, and S235: The processors 231 and 232 respectively repeat the FFT transform of the feedback signal 730 and the operation of measuring the instantaneous out-of-band power from the amplitude characteristic 840 further (M−1) times. The processor 232 sequentially adds operation results $R_2$–$R_M$ to $P_1$.

Steps S234 and S236: When j=M, the processor 232 executes the operation of the average out-of-band power $P_1=P_1/M=(R_1+R_2+ \ldots +R_M)/M$, and obtains the average out-of-band power corresponding to the filter 210 in which the 1st filter coefficient is set.

Similarly, the 2nd-Qth (the number of filter to be compared) filter coefficients are sequentially set in the filter 210. The operation for obtaining the average out-of-band powers $P_2$–$P_Q$ will now be described.

Steps S240 and S250: Since not being i (=1)>=Q, the processor 232 executes i=i+1, and the process returns to step S220. Loop of steps S220, S230, S240, and S250: The processor 232 sequentially sets the 2nd-Qth filter coefficients 820 read from the memory 220 in the filter 210. The processors 231 and 232 measures the average out-of-band powers $P_2$–$P_Q$ corresponding to the filter coefficients.

Steps S240, S260, and S270: In the same way as steps S140, S160, and S170 of the embodiment (1), the processor 232 obtains the minimum average out-of-band power $P_s$, assumes the filter coefficient of the "s"th in-band gradient $\alpha_s$ to be the filter coefficient of the subsequent reference in-band gradient $\alpha_0$, and assumes $P_0=P_s$. Then, the process returns to step S210.

Thereafter, the operation for obtaining the filter coefficient minimizing the average out-of-band power from among the number Q of filters which form the subsequent comparison object is repeated similarly.

Thus, it becomes possible to adaptively equalize the frequency characteristic of the analog portion.

Figure 7:
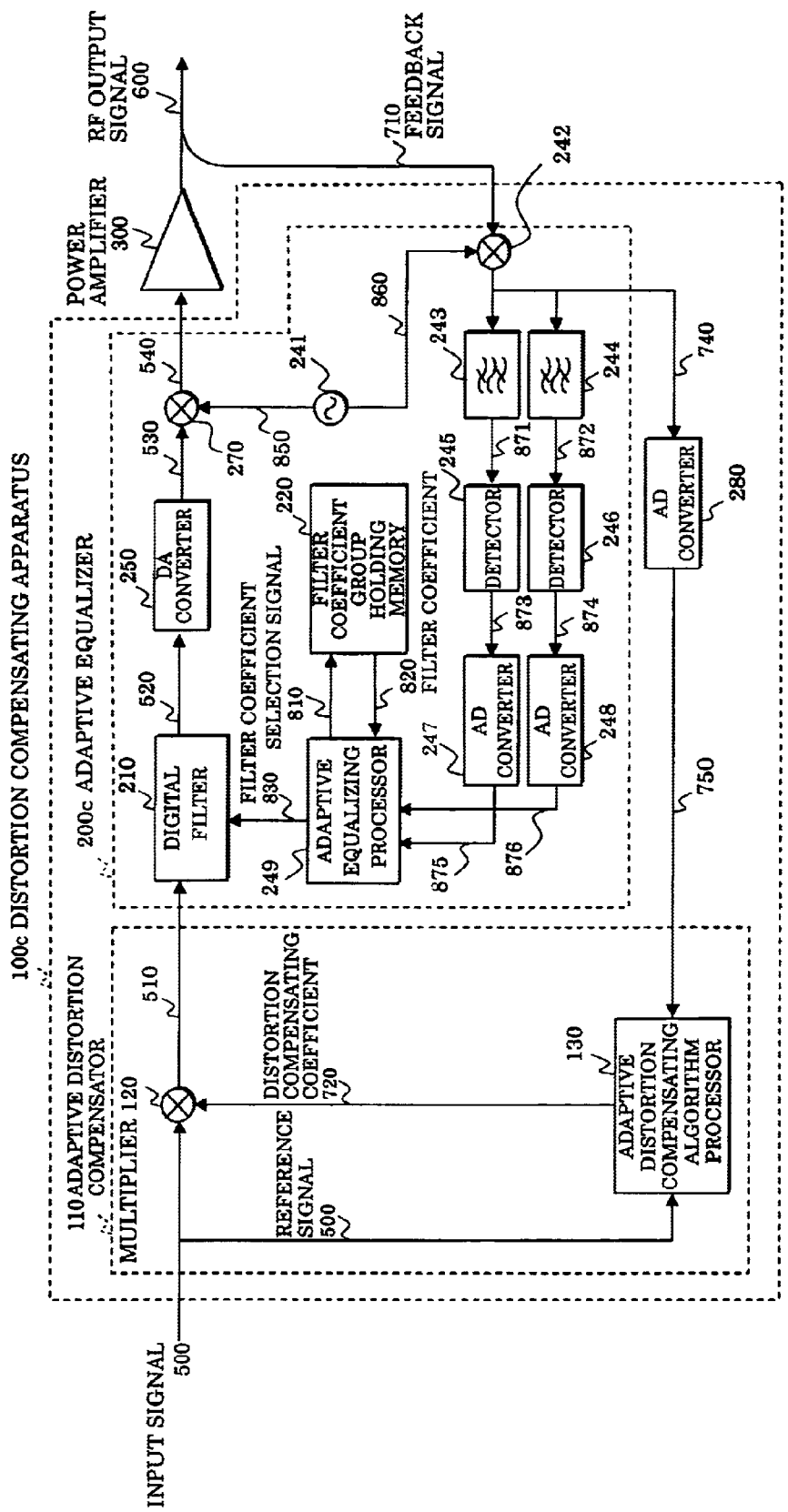
FIG. 7 is a block diagram showing an embodiment (3) of a distortion compensating apparatus according to the present invention.

[3] Embodiment (3) FIG. 7 shows an embodiment (3) of a distortion compensating apparatus 100c according to the present invention. This embodiment (3) is different from the embodiment (2), which measures the out-of-band power from the digital feedback signal 730, in that the out-of-band power is directly measured from the analog feedback signal 710.

Different from the arrangement of the distortion compensating apparatus 100b in the embodiment (2), the arrangement of the distortion compensating apparatus 100c in the embodiment (3) includes, instead of the FFT operation processor 231, an oscillator 241, a mixing circuit (mixer) 242 for mixing an oscillation signal 860 of the oscillator 241 and the feedback signal 710 of the RF band to output a feedback signal 740 whose center frequency is lowered to an Intermediate Frequency (IF) band or to a baseband, a + side band-pass filter 243 and a − side band-pass filter 244 respectively having a passing band of a measurement region of the out-of-band power within the feedback signal 740, detectors 245 and 246 for outputting signals 873 and 874 detecting envelopes of signals 871 and 872 which pass the + side band-pass filter 243 and the − side band-pass filter 244, and AD converters 247 and 248 for performing an AD conversion to the signals 873 and 874.

Also, the distortion compensating apparatus 100c includes a modulator 270 for modulating an analog output signal 530 of the DA converter 250 by a signal 850.

It is to be noted that while the oscillator 241, the mixing circuit 242, and the modulator 270 are arranged, in the same way as FIG. 7, in the input side and the feedback of the power amplifier 300 of the embodiments (1) and (2) respectively shown in FIGS. 1 and 4, they are not shown in FIGS. 1 and 4 for convenience sake.

Also, instead of detecting the envelopes by the detectors 245 and 246 and the AD converters 247 and 248, the power can be directly measured by a power detecting IC or the like.

Furthermore, the distortion compensating apparatus 100c includes an adaptive equalizing algorithm processor 249, instead of the adaptive equalizing algorithm processor 232 of the embodiment (2), for repeatedly measuring a + side instantaneous out-of-band power and a − side instantaneous out-of-band power based on the digital signals 875 and 876 after the AD conversion, for obtaining a + side average out-of-band power P+ and a − side average out-of-band power P_ e.g. for a fixed time, and for adaptively selecting a filter coefficient which minimizes the average out-of-band power to be set in the filter 210.

Figure 8:
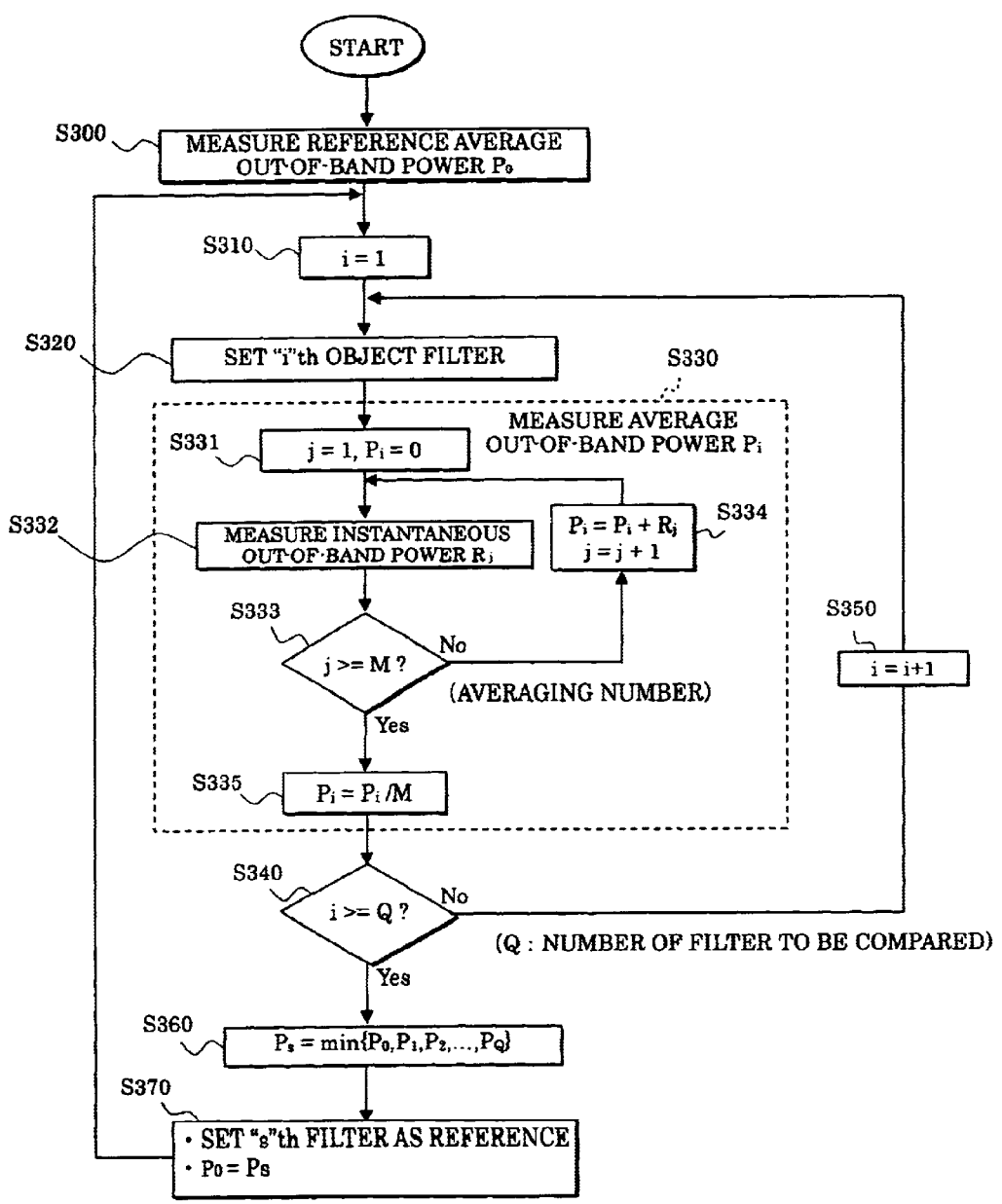
FIG. 8 is a flow chart showing an operation procedure in an embodiment (3) of a distortion compensating apparatus according to the present invention.

FIG. 8 shows an operation procedure of an adaptive equalizer 200c in the embodiment (3). This operation procedure is different from that of the embodiment (2) shown in FIG. 5 only in that step S332 for measuring the instantaneous out-of-band power based on the digital signals 875 and 876 is executed, instead of step S232 for performing the FFT transform to the feedback signal 730 to obtain the amplitude characteristic and step S233 for measuring the instantaneous out-of-band power based on the amplitude characteristic. The other operation procedure is the same as that of the embodiment (2).

In the above-mentioned embodiments (1)–(3), the filter coefficient is obtained based on the average out-of-band power of the measurement region preliminarily set outside the band of the input signal without distinguishing the + side band and the − side band.

Generally, the + side average out-of-band power $P_+$ and the side average out-of-band power P_ at the time when a filter having a certain in-band linear gradient is used are different from each other. Accordingly, when the filter coefficient of the equalizing filter 210 is selected based on the radiant power on only one side, the radiant power of another band may become out of prescription.

Therefore, in embodiments (4)–(9) of the distortion compensating apparatus according to the present invention described hereinafter, measurement regions are respectively set in the + side band and the − side band, and filter coefficients minimizing the out-of-band power based on the + side out-of-band power $P_+$ and the − side out-of-band power $P_-$ in the measurement regions are obtained.

It is to be noted that these embodiments (4)–(9) can be executed by changing the adaptive algorithm in the arrangements of the adaptive equalizers 200a–200c shown in FIGS. 1, 4, and 7. In the following embodiments (4)–(9), the operation will be described based on the adaptive equalizer 200b shown in FIG. 4.

[4] Embodiment (4)

Figure 9A:
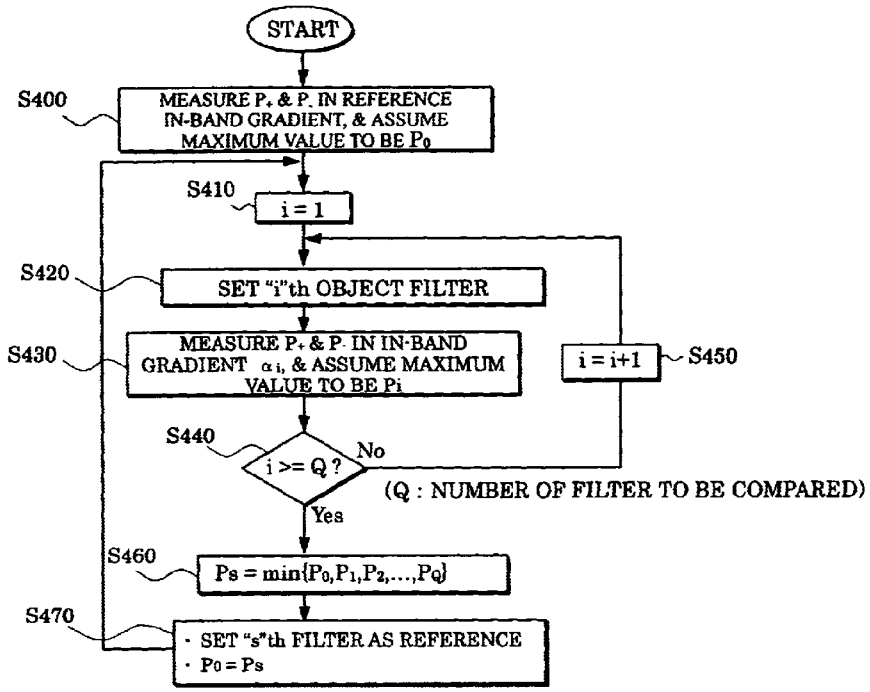
FIG. 9A is a flow chart showing an operation procedure in an embodiment (4) of a distortion compensating apparatus according to the present invention.

FIG. 9A shows the process flow chart of the adaptive equalizer 200b in an embodiment (4) of the present invention. In this embodiment (4), a filter coefficient having e.g. the in-band gradient $\alpha_s$ which minimizes the out-of-band power is obtained based on the values of the average out-of-band power at the time when the filter coefficient having a reference in-band gradient $\alpha_0$ and Q filter coefficients having compared in-band gradients $\alpha_1$-$\alpha_Q$ are set in the filter 210.

This in-band gradient $\alpha_s$ is set as a subsequent reference in-band gradient $\alpha_0$, and the filter coefficients having the in-band gradients $\alpha_1$-$\alpha_Q$ are set as new comparison objects, so that the operation minimizing the out-of-band power is repeated.

Thus, the in-band gradient $\alpha_0$ is converged to the filter coefficient minimizing the average out-of-band power.

Figure 9B:
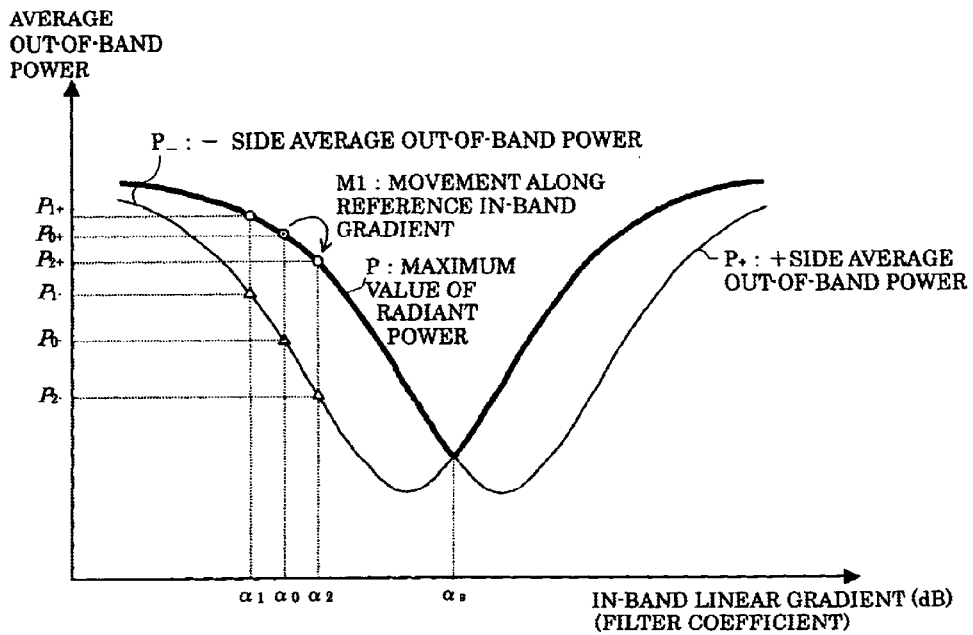
FIG. 9B is a graph showing an average out-of-band power vs in-band linear gradient in an embodiment (4) of a distortion compensating apparatus according to the present invention.

FIG. 9B shows a graph, where an abscissa denotes an in-band linear gradient $\alpha$ of the filter coefficient, and an ordinate denotes the + side average out-of-band power $P_+$ and the − side average out-of-band power $P_-$. This shows the case where the number of the compared objects, Q=2, in which the reference in-band gradient is $\alpha_0$, and the compared in-band gradients are $\alpha_1$ and $\alpha_2$.

Maximum values $P_{1+}$, $P_{0+}$, and $P_{2+}$ (out-of-band powers on a thick line) are determined within the + side out-of-band power $P_+$ and the − side out-of-band power $P_-$ respectively measured when the filter coefficients having the reference and the compared in-band gradients $\alpha_0$, $\alpha_1$, $\alpha_2$ are used, the maximum values are compared with each other, $P_{2+}$ whose maximum value level is minimum is obtained, and the in-band gradient $\alpha_2$ corresponding to the $P_{2+}$ is selected for the subsequent reference in-band gradient $\alpha_0$.

By repeating this operation, it becomes possible to converge the reference in-band gradient $\alpha_0$ to the filter coefficient $\alpha_s$ having the in-band gradient which realizes the maximum equalization amount.

Based on FIG. 9A, the procedure for executing the above-mentioned operation will now be described referring to FIG. 9B. It is to be noted that in this description, the number of filters (in-band gradients) to be compared is assumed to be a generalized Q.

Step S400: The processor 232 (see FIG. 4) measures the + side out-of-band power $P_{0+}$ and the − side out-of-band power $P_{0-}$ in the reference in-band gradient $\alpha_0$, and assumes the maximum value among them to be $P_0$.

Step S410: The processor 232 sets i=1.

Loops of steps S420–S450: The processor 232 sets the filter coefficient having the in-band gradient $\alpha_1$, which forms the i=1st comparison object, in the filter 210, and measures the + side instantaneous out-of-band power and the − side instantaneous out-of-band power based on the amplitude characteristic measured by the processor 231.

The processor 232 obtains the + side average out-of-band power $P_{1+}$ and the − side average out-of-band power $P_{1-}$ which are the average of the measured values obtained by repeating the measurement M times.

The processor 232 assumes the maximum value $P_{1+}$, within the + side average out-of-band power $P_{1+}$ and the − side average out-of-band power $P_{1-}$, to be the average out-of-band power $P_1$.

Hereafter, the processor 232 sequentially sets the 2nd-Qth (the number of filters to be compared) filter coefficients in the filter 210, obtains the + side average out-of-band powers $P_{2+}$–$P_{Q+}$ and the − side average out-of-band powers $P_{2-}$–$P_{Q-}$, and assumes respective maximum values to be the average out-of-band powers $P_2$–$P_Q$ in the same manner.

As a result, a part of the average out-of-band powers $P_0$–$P_Q$ on a maximum value curve (thick line) shown in FIG. 9B are selected.

Steps S440 and S460: The processor 232 obtains the minimum average out-of-band power $P_s$ within the average out-of-band powers $P_0$–$P_Q$.

Step S470: The processor 232 sets the minimum average out-of-band power $P_s$ to the average out-of-band power $P_0$, sets the filter coefficient corresponding to the in-band gradient $\alpha_s$ in the filter 210, and sets the in-band gradient $\alpha_s$ to a subsequent reference in-band gradient $\alpha_0$, so that the process returns to step S410.

By repeating this operation, the in-band gradient $\alpha_0$ of FIG. 9B moves along the thick curve to converge to the in-band gradient $\alpha_5$ which is the minimum point.

Thus, it becomes possible to set the filter coefficient minimizing the average out-of-band power $P_0$ in the filter 210.

[5] Embodiment (5)

Figure 10A:
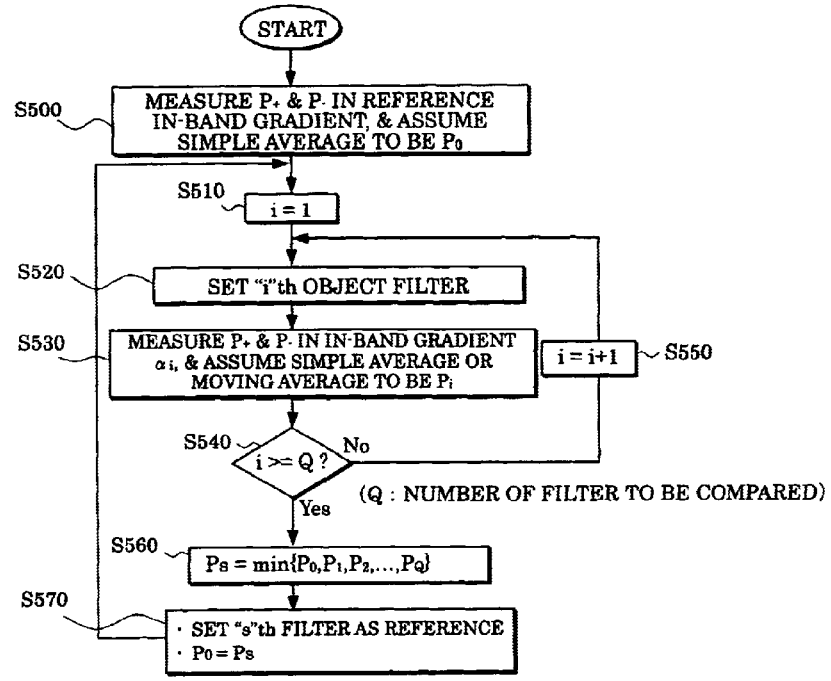
FIG. 10A is a flow chart showing an operation procedure in an embodiment (5) of a distortion compensating apparatus according to the present invention.
Figure 10B:
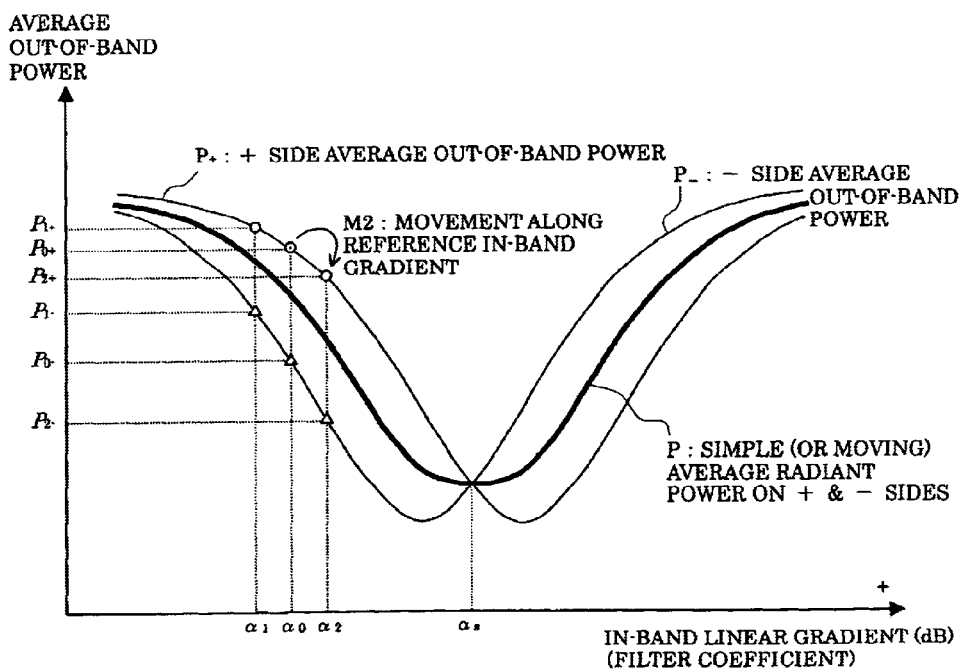
FIG. 10B is a graph showing an average out-of-band power vs in-band linear gradient in an embodiment (5) of a distortion compensating apparatus according to the present invention.

FIGS. 10A and 10B show the adaptive equalizer 200b in an embodiment (5) of the present invention. FIG. 10A shows an operation procedure in the embodiment (5). This operation procedure is different from that of the embodiment (4) shown in FIG. 9A in that a simple average of the + side average out-of-band power $P_+$ and the − side average out-of-band power $P_-$ is assumed to be an average out-of-band power $P_i$ at step S530, instead of step S430 in the embodiment (4) assuming the maximum value, within the + side average out-of-band power $P_+$ and the − side average out-of-band power $P_-$, to be an average out-of-band power $P_i$.

Namely, as shown in FIG. 10B, the average out-of-band powers $P_0$–$P_2$ corresponding to the reference and compared in-band gradients $\alpha_0$-$\alpha_2$ are obtained by the simple average of the following equations (1)–(3). It is to be noted that FIG. 10B shows a case where the number Q of filter coefficients which form the comparison objects=2.

$$P_0=(P_{0+}+P_{0-})/2 \qquad \text{Eq.(1)}$$

$$P_1=(P_{1+}+P_{1-})/2 \qquad \text{Eq.(2)}$$

$$P_2=(P_{2+}+P_{2-})/2 \qquad \text{Eq.(3)}$$

The in-band gradient $\alpha_2$ corresponding to the average out-of-band power which becomes minimum within the average out-of-band powers $P_0$–$P_2$ is assumed to be a subsequent reference in-band gradient $\alpha_0$ (see movement M2 of FIG. 10B).

By repeating this operation, the reference in-band gradient $\alpha_0$ moves along the graph of the thick line in FIG. 10B, and converges to the in-band gradient $\alpha_s$ in which the average out-of-band power becomes minimum. Thus, it becomes possible to select a filter coefficient having an in-band linear gradient which realizes the maximum equalization amount.

It is to be noted that the processor 232 may obtain a moving average of the measured average out-of-band powers, and select the filter coefficient minimizing the moving average.

[6] Embodiment (6)

Figure 11A:
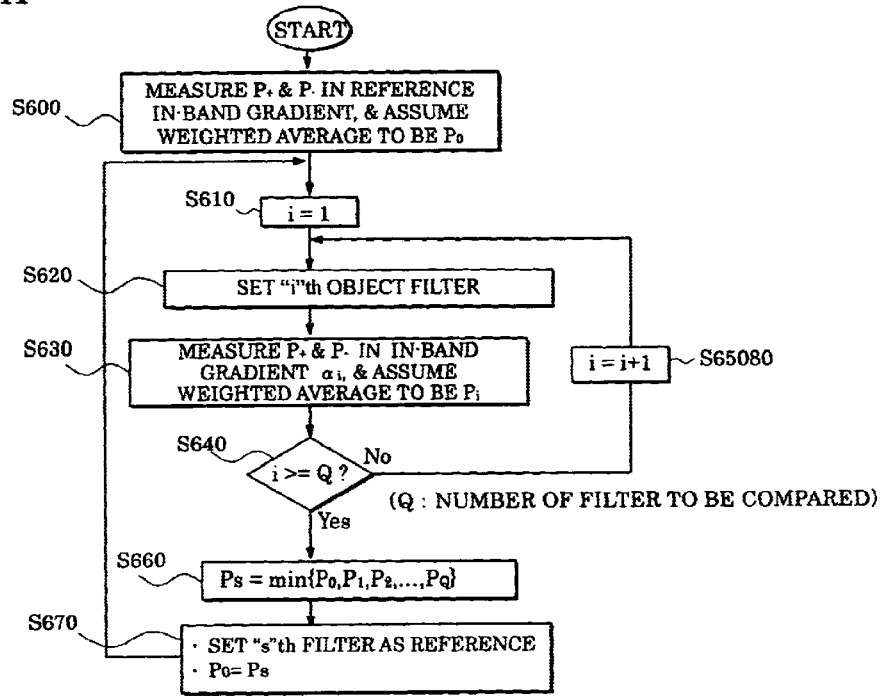
FIG. 11A is a flow chart showing an operation procedure in an embodiment (6) of a distortion compensating apparatus according to the present invention.
Figure 11B:
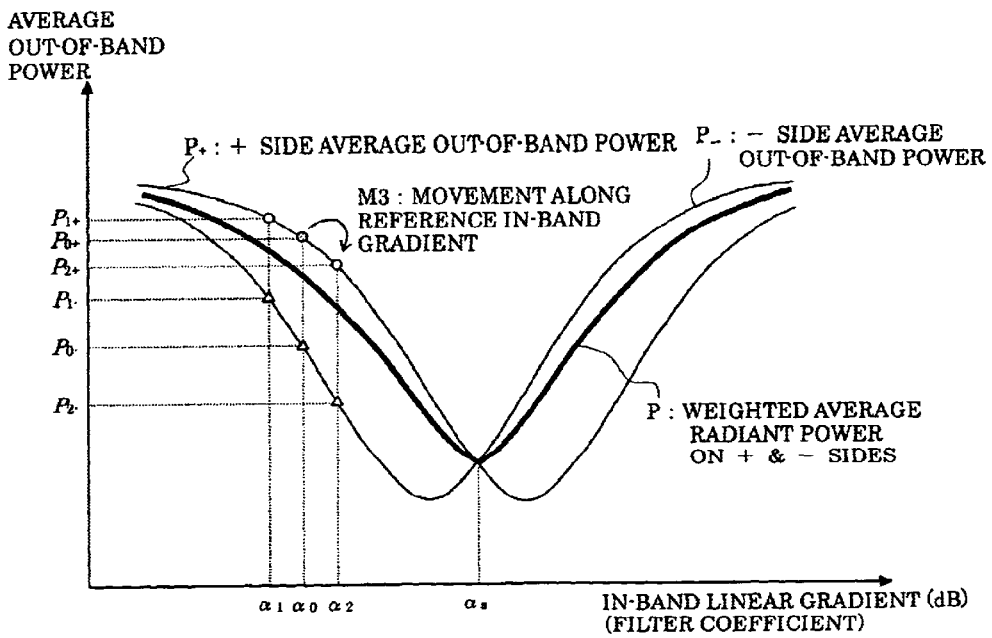
FIG. 11B is a graph showing an average out-of-band power vs in-band linear gradient in an embodiment (6) of a distortion compensating apparatus according to the present invention.

FIGS. 11A and 11B show the adaptive equalizer 200b in an embodiment (6) of the present invention. FIG. 11A shows an operation procedure in the embodiment (6). This operation procedure is different from that of the embodiment (5) in that a weighted average operation is performed at steps S600 and S630, instead of steps S500 and S530 performing a simple average operation.

Namely, in the embodiment (6), as shown by the following equation (4), the average of the + side average out-of-band power $P_+$ and the − side average out-of-band power $P_-$ respectively weighted by $w_1$ and $w_2$ is assumed to be an average out-of-band power P at steps S600 and S630.

$$P = w_1 \times P_+ + w_2 \times P_{31} \qquad \text{Eq.(4)}$$

The weighted coefficients $w_1$ and $w_2$ are determined so as to meet the following equations (5)–(8).

$$w_1 + w_2 = 1 \qquad \text{Eq.(5)}$$

$$w_1 < w_2 \ (P_+ < P_-) \qquad \text{Eq.(6)}$$

$$w_1 = w_2 \ (P_+ = P_-) \qquad \text{Eq.(7)}$$

$$w_1 > w_2 \ (P_+ > P_-) \qquad \text{Eq.(8)}$$

FIG. 11B shows the + side average out-of-band power $P_+$, the − side average out-of-band power $P_-$, and a weighted average out-of-band power P (thick line).

FIG. 11B shows a weighted average in-band power P calculated by the following equations (9)–(11) by a graph of a thick line.

$$w_1 = 1/3, \ w_2 = 2/3 \ (P_+ < P_-) \qquad \text{Eq.(9)}$$

$$w_1 = w_2 = 1/2 \ (P_+ = P_-) \qquad \text{Eq.(10)}$$

$$w_1 = 2/3, \ w_2 = 1/3 \ (P_+ < P_-) \qquad \text{Eq.(11)}$$

In the embodiment (6), an in-band gradient $\alpha_2$ minimizing the weighted average out-of-band power P is assumed to be a subsequent reference in-band gradient $\alpha_0$ at step S660.

Hereafter, by repeating the same operation, the in-band gradient $\alpha_0$ moves along the curve of the weighted average out-of-band power P (thick line) of FIG. 11B, and converges to the in-band gradient $\alpha_s$ which becomes the minimum point, in the same manner.

[7] Embodiment (7)

Figure 12:
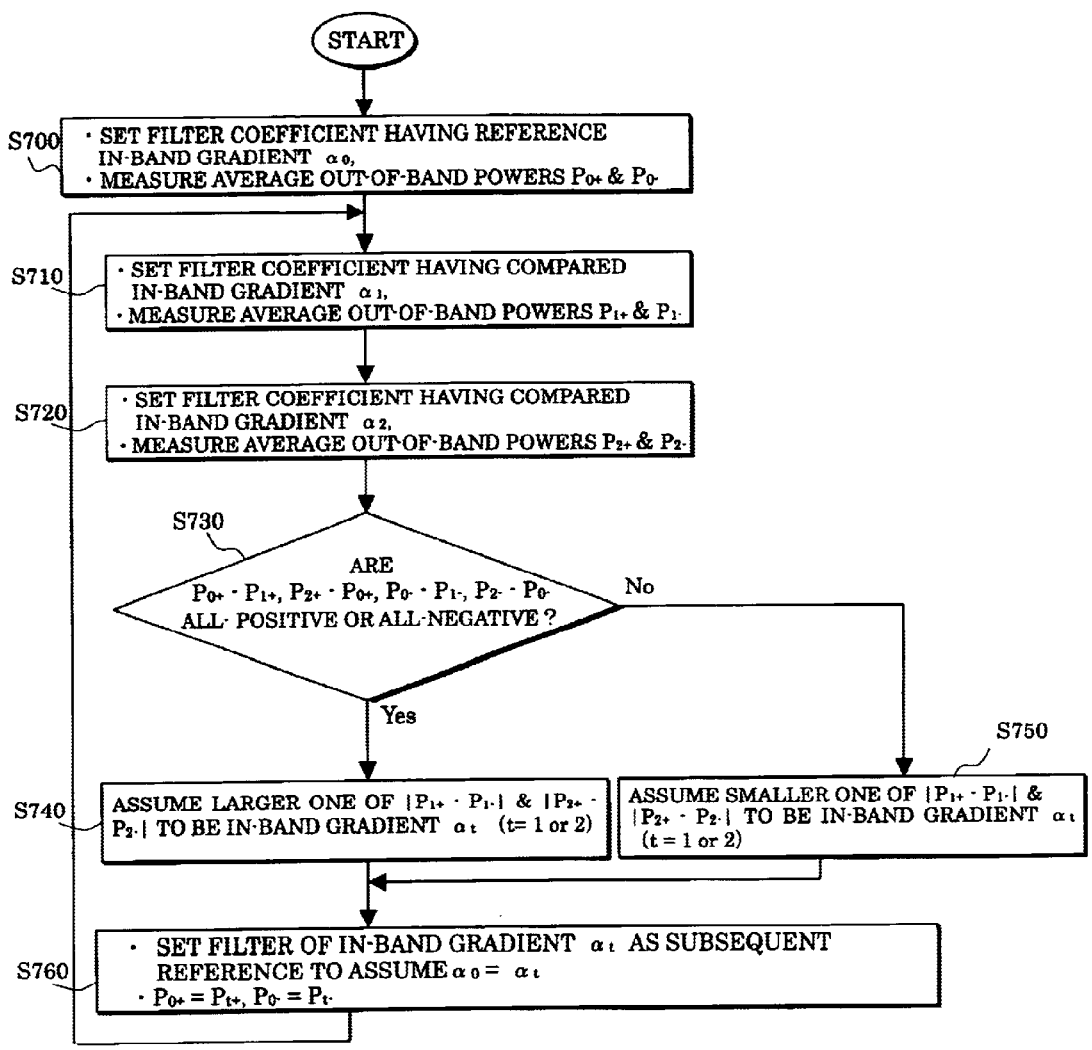
FIG. 12 is a flow chart showing an operation procedure in an embodiment (7) of a distortion compensating apparatus according to the present invention.

FIG. 12 shows the adaptive equalizer 200b in an embodiment (7) of the present invention. In this embodiment (7), the filter coefficient (i.e. in-band linear gradient) is determined based on the gradient of the + side average out-of-band power curve $P_+$, the gradient of the − side average out-of-band power curve $P_-$, and the difference between the + side average out-of-band power $P_+$ and the − side average out-of-band power $P_-$.

Figure 13A:
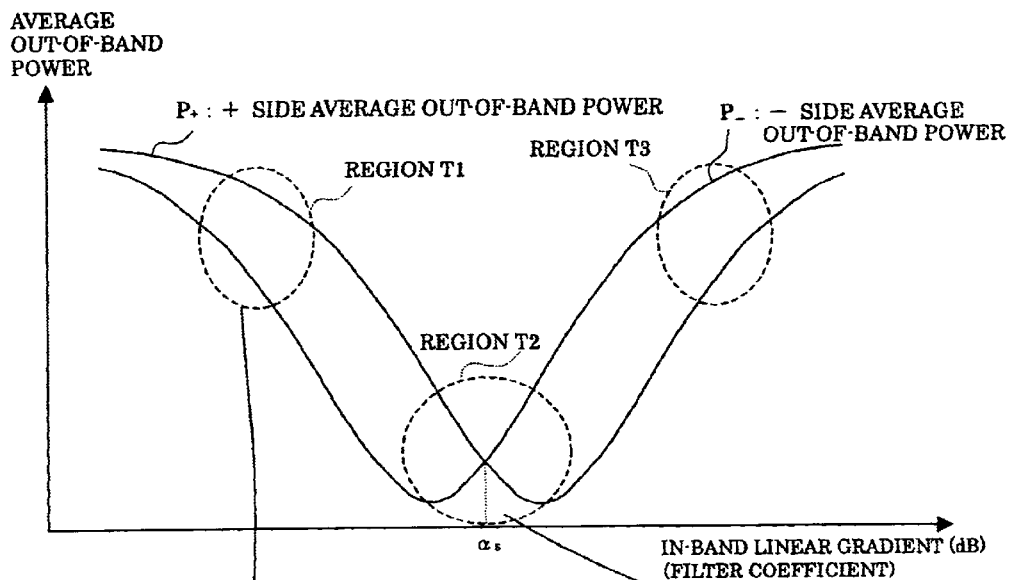
FIGS. 13A–13C are graphs showing an average out-of-band power vs in-band linear gradient in an embodiment (7) of a distortion compensating apparatus according to the present invention.
Figure 13B:
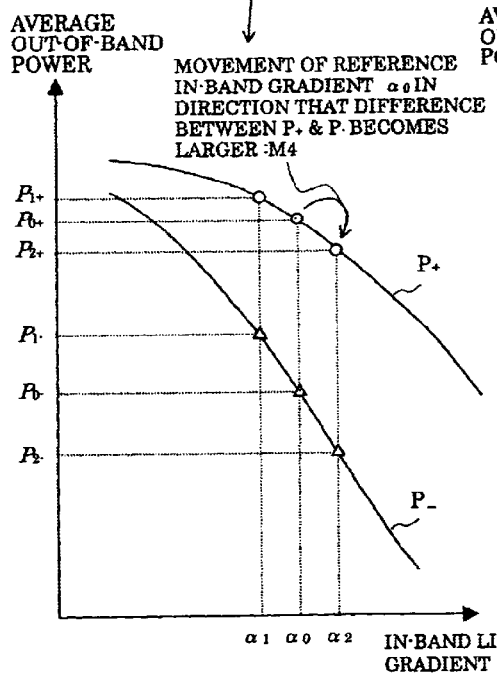
Figure 13C:
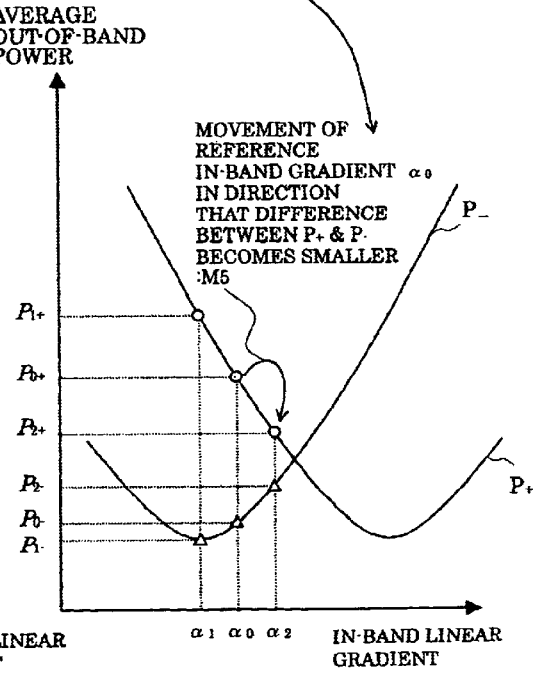

FIG. 13A shows a graph in which an abscissa denotes a linear in-band gradient $\alpha$ within the band, and an ordinate denotes a + side average out-of-band power $P_+$ and the − side average out-of-band power $P_-$. FIGS. 13B and 13C respectively show graphs in which regions T1 and T2 shown in FIG. 13A are enlarged.

The principle of the embodiment (7) will now be described referring to FIGS. 13B and 13C.

When the reference in-band gradient is assumed to be $\alpha_0$, and the compared in-band gradients are assumed to be $\alpha_1$ and $\alpha_2$ in FIG. 13B, the signs (minus in FIG. 13B) of the gradient of the curve of the + side average out-of-band power $P_+$ between the in-band gradients $\alpha_0$ and $\alpha_1$, and the in-band gradients $\alpha_0$ and $\alpha_2$ are the same. Similarly, the signs (minus in FIG. 13B) of the gradient of the curve of the − side average out-of-band power $P_-$ between the in-band gradients $\alpha_0$ and $\alpha_1$, and the in-band gradients $\alpha_0$ and $\alpha_2$ are the same. This will be given by the following equations (12)–(15).

$$P_{0+} - P_{1+} < 0 \qquad \text{Eq.(12)}$$

$$P_{2+} - P_{0+} < 0 \qquad \text{Eq.(13)}$$

$$P_{0-} - P_{1-} < 0 \qquad \text{Eq.(14)}$$

$$P_{2-} - P_{0-} < 0 \qquad \text{Eq.(15)}$$

At this time, in order to converge the in-band gradient $\oplus_0$ to the in-band gradient $\alpha_s$ shown in FIG. 13A, it is recognized that a movement M4 of the in-band gradient $\alpha_0$ has only to be performed in the direction toward the in-band gradient $\alpha_2$ so that the difference between the + side average out-of-band power $P_+$ and the − side average out-of-band power $P_-$ may become larger.

Similarly, when the signs of the gradients of the curves in a region T3 shown in FIG. 13A, i.e. the + side average out-of-band power $P_+$ and the − side average out-of-band power $P_-$, are the same plus, the movement has only to be performed in the direction of the in-band gradient $\alpha_1$ so that the difference between the + side average out-of-band power $P_+$ and the − side average out-of-band power $P_-$ may become larger.

Conversely in the region T2 shown in FIG. 13C, it is indicated by the following equations (16)–(19) that one or more signs of the gradients between the in-band gradients $\alpha_0$ and $\alpha_1$, and the in-band gradients $\alpha_0$ and $\alpha_2$ of the curves of the + side average out-of-band power $P_+$ and the − side average out-of-band power $P_-$ are different.

$$P_{0+} - P_{1+} < 0 \qquad \text{Eq.(16)}$$

$$P_{2+} - P_{0+} < 0 \qquad \text{Eq.(17)}$$

$$P_{0-} - P_{1-} > 0 \qquad \text{Eq.(18)}$$

$$P_{2-} - P_{0-} > 0 \qquad \text{Eq.(19)}$$

In such a region T2, it is recognized that a movement M5 has only to be performed in the direction toward the in-band gradient $\alpha_2$ so that the difference between the + side average out-of-band power $P_+$ and the − side average out-of-band power $P_-$ may become smaller.

The operation procedure in the embodiment (7) will now be described referring to FIG. 12.

Step S700: The processor 232 (see FIG. 4) sets the filter coefficient having the reference in-band gradient $\alpha_0$ in the filter 210, and performs the operations of the + side average out-of-band power $P_{0+}$ and the − side average out-of-band power $P_{0-}$ from the amplitude characteristic from the FFT operation processor 231.

Step S710: The processor 232 sets the filter coefficient having the compared in-band gradient $\alpha_1$ in the filter 210, and performs the operations of the + side average out-of-band power $P_{1+}$ and the − side average out-of-band power $P_{1-}$.

Step S720: The processor 232 similarly sets the filter coefficient having the compared in-band gradient $\alpha_2$ in the filter 210, and performs the operations of the + side average out-of-band power $P_{2+}$ and the − side average out-of-band power $P_{2-}$.

Step S730: When the processor 232 performs the operations of $P_{0+}-P_{1+}$, $P_{2+}-P_{0+}$, $P_{0-}-P_{1-}$, and $P_{2-}-P_{0-}$, and all of the operation results have the same sign, the process proceeds to step S740. When at least a single sign is different, the process proceeds to step S750.

Step S740: The processor 232 assumes the in-band gradient of the larger of $|P_{1+}-P_{1-}|$ and $|P_{2+}-P_{2-}|$ to be $\alpha_t$ (t=1 or 2), so that the process proceeds to step S760.

Step S750: The processor 232 assumes the in-band gradient of the smaller of $|P_{1+}-P_{1-}|$ and $|P_{2+}-P_{2-}|$ to be $\alpha_t$ (t=1 or 2), so that the process proceeds to step S760.

Step S760: After the processor 232 assumes the in-band gradient $\alpha_t$ to be a subsequent reference in-band gradient $\alpha_0$, and assumes $P_{0+}=P_{t+}$, $P_{0-}=P_{t-}$ (movement M4 in FIG. 13B and movement M5 in FIG. 13C), the process returns to step S710.

The processor 232 repeats steps S710–S760, so that the reference in-band gradient $\alpha_0$ adaptively moves to converge to the in-band gradient $\alpha_s$ (see FIG. 13A) minimizing the average out-of band power.

[8] Embodiment (8)

Figure 14:
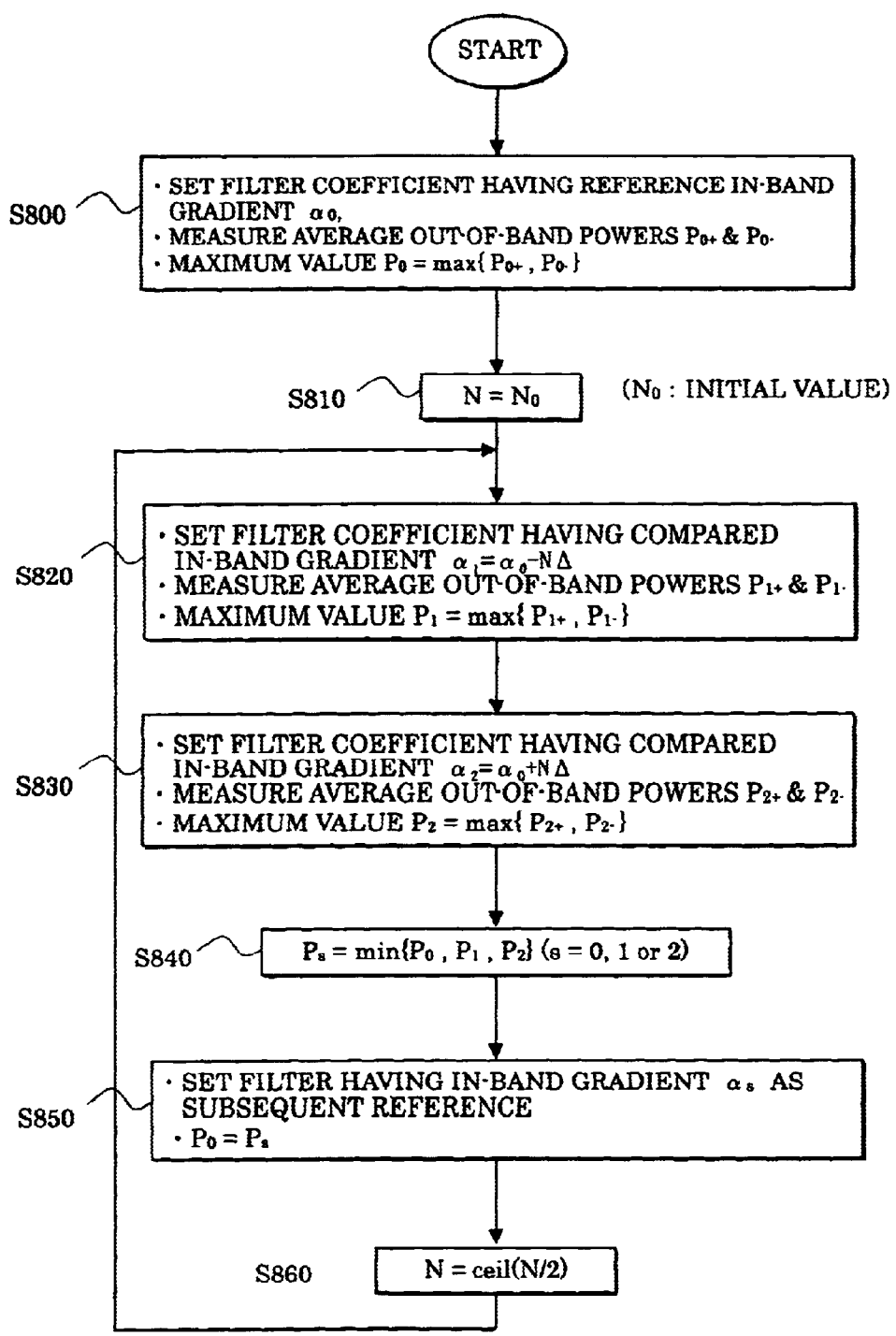
FIG. 14 is a flow chart showing an operation procedure in an embodiment (8) of a distortion compensating apparatus according to the present invention.

FIG. 14 shows the adaptive equalizer 200b in an embodiment (8) of the present invention. In this embodiment (8), the reference in-band gradient $\alpha_0$ is moved according to the feedback loop "frequency" counted from the start of the adaptive algorithm in the embodiments (4)–(7).

"Distance from reference" of the in-band gradients $\alpha_1$ and $\alpha_2$ a unit gradient $\Delta$ in the direction of −/+ away from the reference in-band gradient $\alpha_0$ is referred to as −1/+1.

Namely, $\alpha_1$ means $\alpha_0-\Delta$, and $\alpha_2$ means $\alpha_0+\Delta$.

FIG. 15A shows a correspondence between the "loop frequency" and the "distance from reference".

Immediately after the start of the adaptive algorithm, namely, when the loop frequency="0", the adaptive equalizer 200b assumes the filter coefficient having the in-band gradients $\alpha_1$ and $\alpha_2$±20 away from the filter coefficient having the reference in-band gradient $\alpha_0$ to be compared, and assumes either of the in-band gradient $\alpha_1$ or $\alpha_2$ to be a new reference in-band gradient $\alpha_0$ based on the comparison result.

One loop is finished with this processing, so that the loop recursive frequency="1". Then, the adaptive equalizer 200b assumes the subsequent compared in-band gradients $\alpha_1$ and $\alpha_2$, ±10 away from the new reference in-band gradient $\alpha_0$, to be compared in-band gradients. Hereafter, the compared in-band gradients $\alpha_1$ and $\alpha_2$ are determined based on how many loops has been finished similarly.

Thus, there is an effect of increasing a convergence of the adaptive algorithm especially when a process starts from the in-band reference gradient $\alpha_0$ far away from a convergence point.

It is to be noted that when the loop frequency is five or more in FIG. 15A, a compared position is a fixed "1". This is because it is determined that the in-band gradient $\alpha_0$ can be moved to the proximity of the convergence point by the loop frequency of five or more in this example. In order to avoid a large change of the average out-of-band power proximity of the convergence point, the compared in-band gradients $\alpha_1$ and $\alpha_2$ are prevented from being much deviated from the reference in-band gradient.

FIGS. 15B and 15C show operations respectively at the time when the loop frequency="3" and when the loop frequency="4", in the case where the correspondence between the "loop frequency" and the "compared in-band gradient" is set as shown in FIG. 15A.

Namely, in FIG. 15B, the reference in-band gradients $\alpha_1$ and $\alpha_2$ which are the comparison objects ±3 away from the reference in-band gradient $\alpha_0$. For example, since the adaptive algorithm operates so that the maximum value may become minimum in the embodiment (4), the reference in-band gradient $\alpha_0$ performs a movement M6, so that the in-band gradient $\alpha_2$ becomes a new reference in-band gradient $\alpha_0$.

FIG. 15C shows the new reference in-band gradient $\alpha_0$. At this time, the loop frequency="4". When "loop frequency"= "4", the "distance from reference"="2" by referring to FIG. 15A. Accordingly the compared in-band gradients from the reference in-band gradient $\alpha_0$ are in-band gradients $\alpha_1$ and $\alpha_2$±2 away from the in-band gradient $\alpha_0$.

By repeating such an operation, in which a comparison region is made relatively large when the in-band reference gradient is far apart from the convergence point, and the comparison region is inversely made relatively small when the in-band reference gradient is in proximity to the convergence point, the algorithm increases the convergence and the in-band gradient converges to one minimizing the average out-of-band power.

The operation procedure of the embodiment (8) will now be described referring to FIG. 14. It is to be noted that the adaptive algorithm assuming the maximum values within the + side average out-of-band power $P_+$ and − side average out-of-band power $P_-$ to be the average out-of-band power P is adopted in the same way as the embodiment (4). Also, in this embodiment (8), "distance from reference" is obtained by an equation without using the table of FIG. 15A.

Step S800: The processor 232 sets the filter coefficient having the reference in-band gradient $\alpha_0$ in the filter 210, performs the operations of the + side average out-of-band power $P_{0+}$ and the − side average out-of-band power $P_{0-}$ based on the amplitude characteristic 840 measured by the FFT operation processor 231, and assumes the average out-of-band power $P_0$ to be max $\{P_{0+}, P_{0-}\}$.

Step S810: The processor 232 initialize N to 20.

Step S820: The processor 232 sets the filter coefficient having the in-band gradient $\alpha_1$ deviating by −20 from the in-band gradient $\alpha_0$ in the filter 210, performs the operations of the + side average out-of-band power $P_{1+}$ and the − side average out-of-band power $P_{1-}$ from the amplitude characteristic 840 measured by the FFT operation processor 231, and assumes the average out-of-band power $P_1$ to be max $\{P_{1+}, P_{1-}\}$.

Step S830: The processor 232 sets the filter coefficient having the in-band gradient $\alpha_2$ deviating by +20 from the in-band gradient $\alpha_0$ in the filter 210, performs the operations of the + side average out-of-band power $P_{2+}$ and the − side average out-of-band power $P_{2-}$, and assumes the average out-of-band power $P_2$ to be max $\{P_{2+}, P_{2-}\}$.

Step S840: The processor 232 performs the operation of $P_s=\min \{P_0, P_1, P_2\}$ (s=0, 1 or 2).

Step S850: The processor 232 sets the filter coefficient having the in-band gradient $\alpha_s$ in the filter 210, and assumes the average out-of-band power $P_0$ to be $P_s$, and the in-band gradient $\alpha_s$ to be the subsequent reference in-band gradient $\alpha_0$.

Step S860: The processor 232 executes N=ceil (N/2), and the process returns to step S820. As a result, N is set with 20 (initial value), 10, 5, 3, 2, and 1, every time the loop of steps S820–S860 is completed.

By repeating the above-mentioned operation, it becomes possible to rapidly minimize the average out-of-band power $P_0$ compared with the embodiment (4).

It is to be noted that the processor 232 may preliminarily hold a correspondence table shown in FIG. 15A instead of performing N=ceil (N/2) operation, count the loop frequency at step S860, and obtain the "distance from reference" corresponding to the "loop frequency" from the correspondence table.

[9] Embodiment (9)

Figure 16:
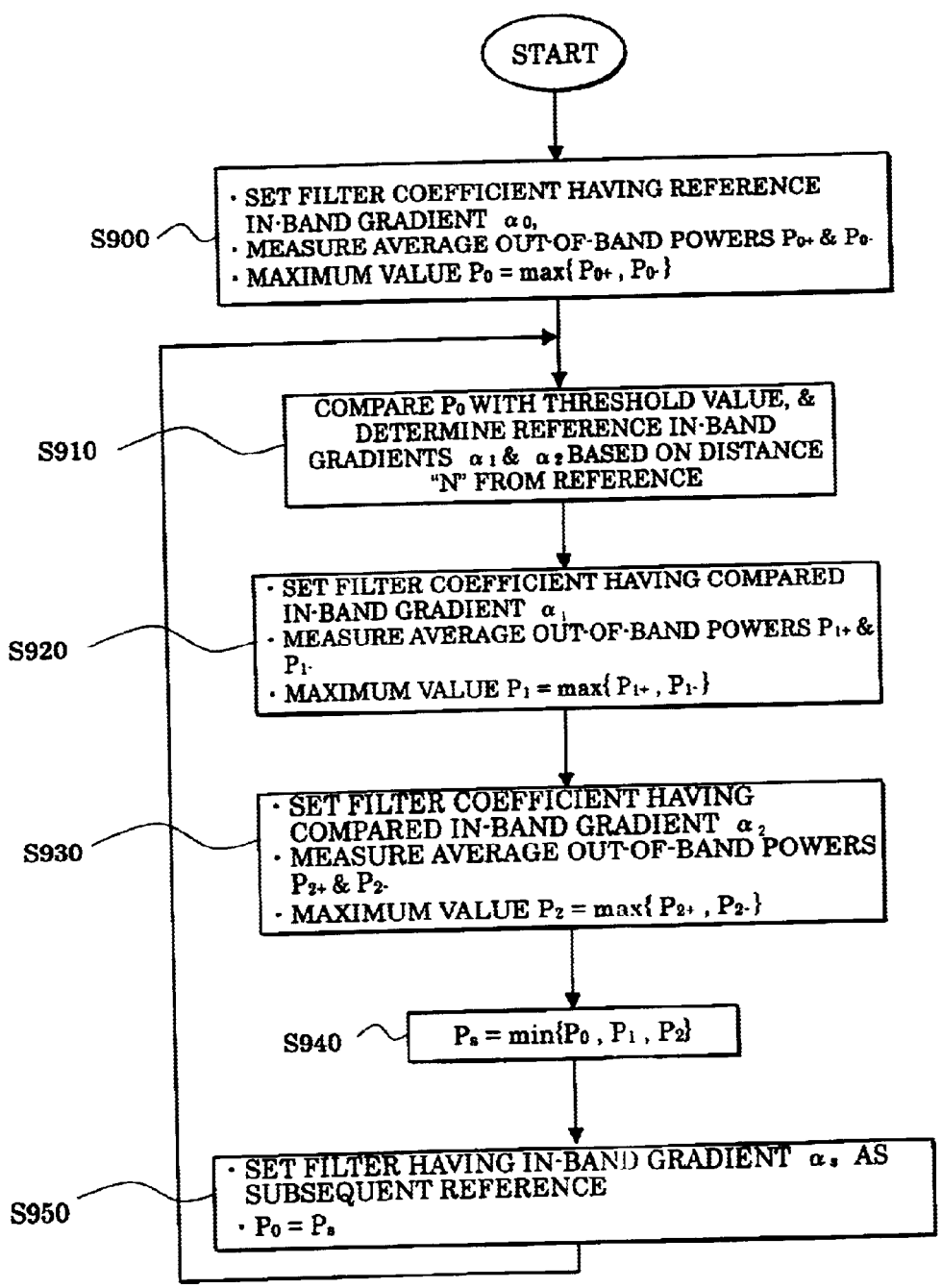
FIG. 16 is a flow chart showing an operation procedure in an embodiment (9) of a distortion compensating apparatus according to the present invention.

FIG. 16 shows the adaptive equalizer 200b in an embodiment (9) of the present invention. In this embodiment (9), firstly obtained is the maximum value $P_0$=max $\{P_{0+}, P_{0-}\}$ within the + side average out-of-band power $P_+$ and the − side average out-of-band power $P_-$ at the time when the filter coefficient having the reference in-band gradient $\alpha_0$ is set in the filter 210.

By comparing this maximum value $P_0$ with a predetermined threshold value $P_L$, the "distance from reference" of the compared in-band gradients $\alpha_1$ and $\alpha_2$ is determined based on the comparison result. Thus, the convergence of the adaptive algorithm is increased.

Figures 17A, 17B:
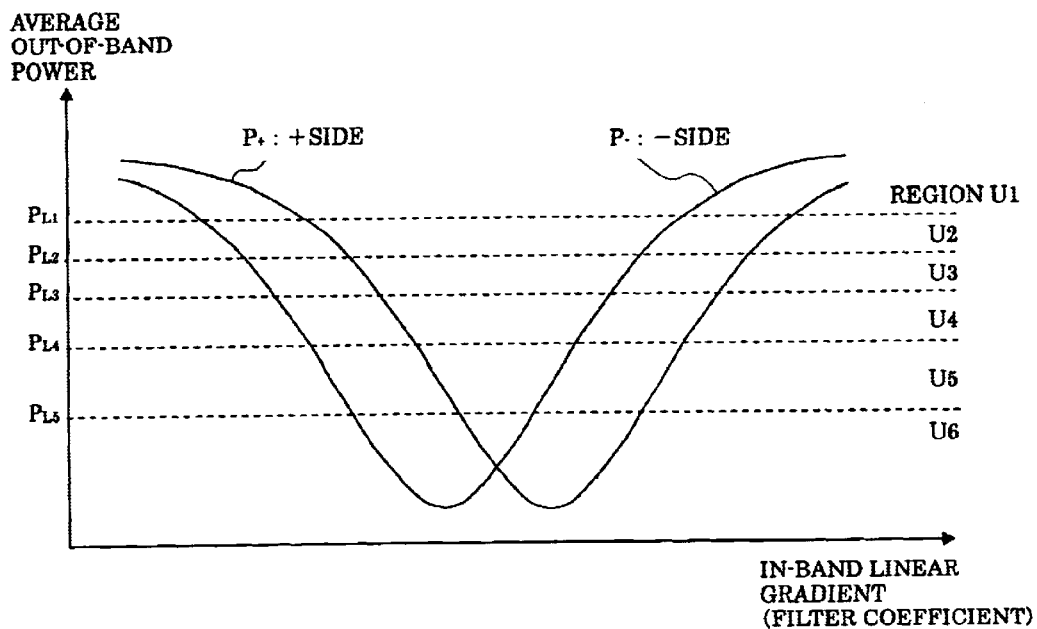
FIGS. 17A and 17B are diagrams showing a threshold setting example in an embodiment (9) of a distortion compensating apparatus according to the present invention.

FIG. 17A shows a setting example of the threshold value $P_L$. Threshold values $P_{L1}$–$P_{L5}$ are set for the maximum value $P_0$, and the average out-of-band power is divided into regions U1–U6.

FIG. 17B shows a table example of the "distance from reference in-band gradient" corresponding to the regions U1–U6 set by the threshold values $P_{L1}$–$P_{L5}$. For example, in the presence of the maximum value $P_0$ in the region U1 ($P_0 > P_{L1}$) shown in FIG. 17A, the compared in-band gradients are in-band gradients $\alpha_1$ and $\alpha_2 \pm 20$ away from the in-band gradient $\alpha_0$. In the presence of the maximum value $P_0$ in the region U2 ($P_{L2} < P_0 = < P_{L1}$), the compared in-band gradients are in-band gradients $\alpha_1$ and $\alpha_2 \pm 10$ away from $\alpha_0$.

Figure 18A:
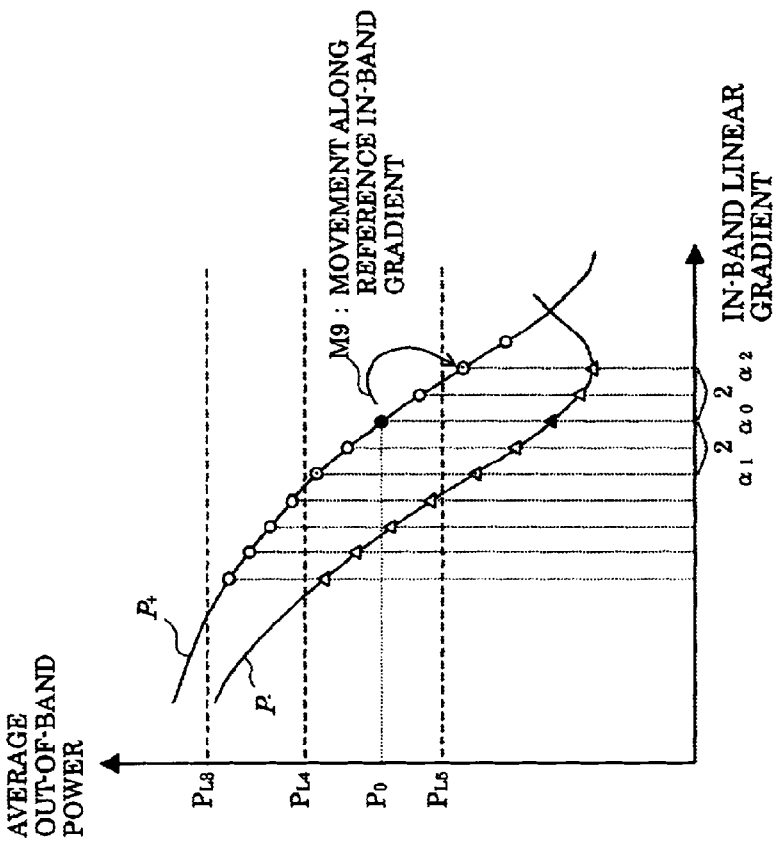
FIGS. 18A and 18B are diagrams showing an adaptive algorithm example in an embodiment (9) of a distortion compensating apparatus according to the present invention.
Figure 18B:
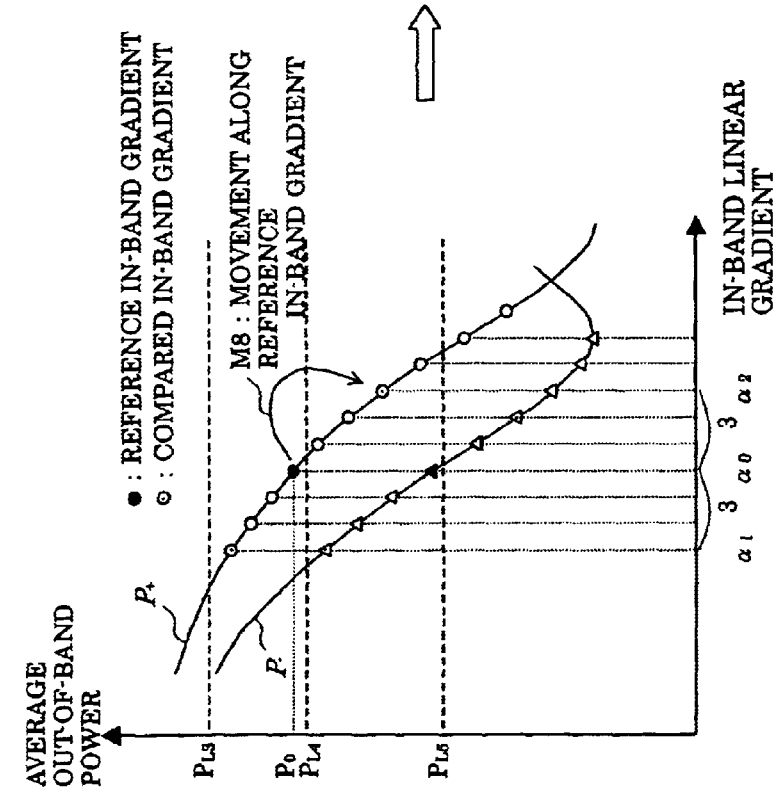
Figure 19A:
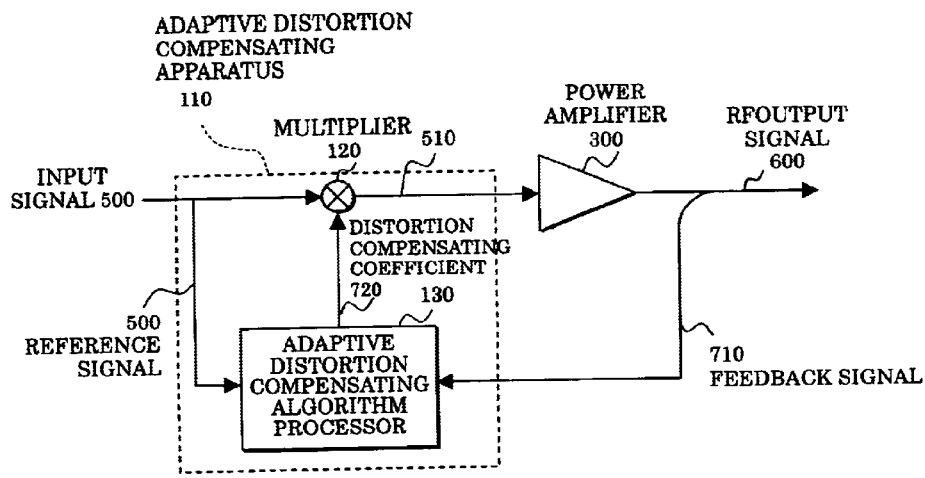
FIG. 19A is a block diagram showing an arrangement of a prior art adaptive predistorter type distortion compensating apparatus.
Figure 19B:
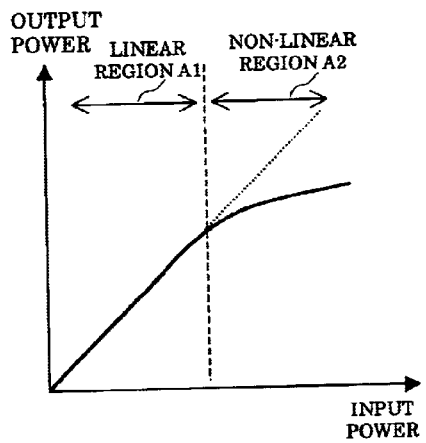
FIGS. 19B and 19C are graphs showing a characteristic of a prior art adaptive predistorter type distortion compensating apparatus.
Figure 19C:
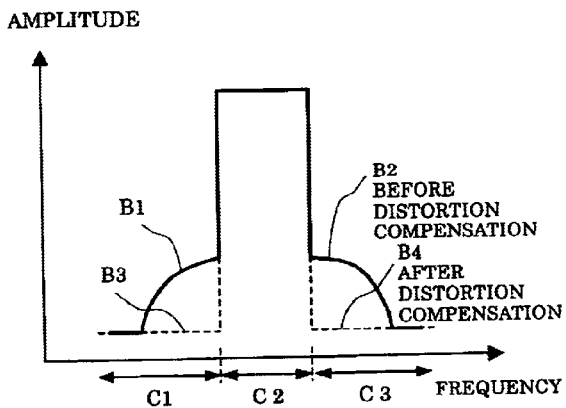

FIGS. 18A and 18B show an adaptive algorithm in the embodiment (9). In FIG. 18A, the maximum value of the average out-of-band power $P_0$ at the time when the filter coefficient having the in-band gradient $\alpha_0$ is set in the filter 210 resides in the region of $P_{L4} < P_0 = < P_{L3}$, and the compared in-band gradients are in-band gradients $\alpha_1$ and $\alpha_2 \pm 3$ away from the reference in-band gradient $\alpha_0$ referring to FIG. 17B.

If the adaptive algorithm is supposed to be operated so that the maximum value may become minimum, the reference in-band gradient $\alpha_0$ performs a movement M8, and the in-band gradient $\alpha_2$ assumes a new reference in-band gradient $\alpha_0$. FIG. 18B shows the new reference in-band gradient $\alpha_0$.

The average out-of-band power $P_0$ corresponding to the in-band gradient $\alpha_0$ resides in the region of $P_{L5} < P_0 = < P_{L4}$, and the compared in-band gradient assumes in-band gradients $\alpha_1$ and $\alpha_2 \pm 2$ away from the reference in-band gradient $\alpha_0$ referring to FIG. 17B. Furthermore, after this operation, the reference in-band gradient $\alpha_0$ shifts to the in-band gradient $\alpha_2$ by a movement M9.

Thus, when the in-band reference gradient is far away from the convergence point, the compared gradient region is made large. Inversely when the in-band gradient is in proximity to the convergence point the compared gradient region is made small, whereby the convergence of the adaptive algorithm is increased and the in-band gradient converges to the in-band gradient minimizing the average out-of-band power.

The operation procedure of the embodiment (9) will now be described referring to FIG. 16. It is to be noted that the algorithm having the maximum value within the + side average out-of-band power $P_+$ and the − side average out-of-band power $P_-$ to be the average out-of-band power P is used in the same way as the embodiment (4).

Step S900: The processor 232 sets the filter coefficient having the reference in-band gradient $\alpha_0$ in the filter 210, performs the operations of the + side average out-of-band power $P_{0+}$ and the − side average out-of-band power $P_{0-}$ based on the amplitude characteristic 840 measured by the FFT operation processor 231, and assumes the average out-of-band power $P_0$ to be max $\{P_{0+}, P_{0-}\}$.

Step S910: The processor 232 compares the average out-of-band power $P_0$ with the threshold value of FIG. 17B, determines the "distance from reference in-band gradient $\alpha_0$"=N, and determines compared in-band gradients $\alpha_1$ and $\alpha_2$.

Step S920: The processor 232 sets the filter coefficient having the in-band gradient $\alpha_1$ in the filter 210, performs the operations of the + side average out-of-band power $P_{1+}$ and the − side average out-of-band power $P_{1-}$, and assumes the average out-of-band power $P_1$ to be max $\{P_{1+}, P_{1-}\}$.

Step S930: The processor 232 sets the filter coefficient having the in-band gradient $\alpha_2$ in the filter 210, performs the operations of the + side average out-of-band power $P_{2+}$ and the − side average out-of-band power $P_{2-}$, and assumes the average out-of-band power $P_2$ to be max $\{P_{2+}, P_{2-}\}$.

Step S940: The processor 232 performs the operation of $P_s$=min $[P_0, P_1, P_2]$ (s=0, 1, or 2).

Step S950: The processor 232 sets the filter coefficient having the in-band gradient $\alpha_s$ in the filter 210, assumes the subsequent reference in-band gradient $\alpha_0$ to be the in-band gradient $\alpha_s$, assumes the average out-of-band power $P_0$ to be $P_s$, and then the process returns to step S910.

By repeating the above-mentioned operation, the average out-of-band power $P_0$ increases the convergence compared with the embodiment (4) and converges to the minimum value.

As described above, a distortion compensating apparatus according to the present invention is arranged such that an adaptive equalizing processor adaptively selects, from among a filter coefficient group preliminarily held in a memory, a filter coefficient which makes an out-of-band power of an output signal reduced to be set in a digital filter. Therefore, it becomes possible to adaptively equalize a frequency characteristic of a non-linear distortion circuit (analog circuit). Also, by using the filter coefficient preliminarily held in the memory, it becomes possible to reduce a computing amount.

What we claim is:

1. A distortion compensating apparatus comprising:
    an adaptive distortion compensator for controlling an input signal to a circuit with a non-linear distortion by an adaptive algorithm so as to reduce an error between a reference signal and a feedback signal from the non-linear distortion circuit, thereby compensating the non-linear distortion;
    a digital filter connected between the adaptive distortion compensator and the non-linear distortion circuit, or to a pre-stage of the adaptive distortion compensator;
    a memory for preliminarily holding a filter coefficient group set in the digital filter; and
    an adaptive equalizing processor for adaptively selecting, from among the filter coefficient group, a filter coefficient which makes an out-of-band power of the feedback signal reduced to be set in the digital filter.

2. The distortion compensating apparatus as claimed in claim 1 wherein the adaptive equalizing processor comprises a Fourier transform operation processor for performing a Fourier transform to the feedback signal to output an amplitude spectrum of the feedback signal, and an adaptive equalizing algorithm processor for selecting, from among the filter coefficient group, a filter coefficient which makes the out-of-band power of the feedback signal reduced by the adaptive algorithm based on the amplitude spectrum to be provided to the digital filter.

3. The distortion compensating apparatus as claimed in claim 1 wherein the adaptive equalizing processor comprises a band-pass filter which passes a signal of a predetermined band outside a band of the feedback signal, a detector for detecting an envelope of the predetermined band-pass signal, an AD converter for performing an analog/digital conversion to the detected signal, and an adaptive equalizing algorithm processor for selecting, from among the filter coefficient group, a filter coefficient which makes the out-of-band power reduced by an adaptive algorithm based on a digitally converted signal to be provided to the digital filter.

4. The distortion compensating apparatus as claimed in claim 1 wherein the filter coefficient group comprises a row of a plurality of filter coefficients for setting an in-band amplitude characteristic of the input signal of the digital filter to a predetermined in-band gradient.

5. The distortion compensating apparatus as claimed in claim 1 wherein the out-of-band power comprises an average out-of-band power of a plurality of measured instantaneous out-of-band powers.

6. The distortion compensating apparatus as claimed in claim 1 wherein the adaptive equalizing processor measures a radiant power in one or more predetermined out-of-band measurement regions as the out-of-band power.

7. The distortion compensating apparatus as claimed in claim 6 wherein the adaptive equalizing processor adaptively selects a filter coefficient which nulls a difference in out-of-band powers between two measurement regions measured using the same filter coefficient respectively.

8. The distortion compensating apparatus as claimed in claim 6 wherein the adaptive equalizing processor selects a maximum value within out-of-band powers measured for each filter coefficient respectively in a plurality of the measurement regions, and adaptively selects a filter coefficient which minimizes the maximum value.

9. The distortion compensating apparatus as claimed in claim 6 wherein the adaptive equalizing processor obtains a simple average of out-of-band powers measured for each filter coefficient respectively in a plurality of the measurement regions, and adaptively selects a filter coefficient which minimizes the average.

10. The distortion compensating apparatus as claimed in claim 6 wherein the adaptive equalizing processor obtains a moving average of out-of-band powers measured for each filter coefficient respectively in a plurality of the measurement regions, and adaptively selects a filter coefficient which minimizes the average.

11. The distortion compensating apparatus as claimed in claim 6 wherein the adaptive equalizing processor obtains a weighted average of out-of-band powers measured for each filter coefficient respectively in a plurality of the measurement regions, and adaptively selects a filter coefficient which minimizes the average.

12. The distortion compensating apparatus as claimed in claim 6 wherein the adaptive equalizing processor adaptively converges a filter coefficient of a reference in-band gradient to a filter coefficient which minimizes an out-of-band power, by repeating that when signs of differences in out-of-band power, measured by a reference in-band gradient or one or more compared in-band gradients in each measurement region, between adjoining in-band gradients are same, a compared in-band gradient having a larger absolute value of a difference between both out-of-band powers measured at the compared in-band gradient is assumed to be a subsequent reference in-band gradient, and when the signs are different from each other, a compared in-band gradient having a smaller absolute value of a difference between both out-of-band powers is assumed to be a subsequent reference in-band gradient.

13. The distortion compensating apparatus as claimed in claim 7 wherein the adaptive equalizing processor changes distance on a row of a filter coefficient between a filter coefficient having a reference in-band gradient and a filter coefficient having a compared in-band gradient, corresponding to a feedback number counted after a start of an algorithm.

14. The distortion compensating apparatus as claimed in claim 7 wherein the adaptive equalizing processor changes distance on a row of a filter coefficient between a filter coefficient having a reference in-band gradient and a filter coefficient having a compared in-band gradient, corresponding to an average out-of-band power value when the filter coefficient having a reference in-band gradient is applied.

15. The distortion compensating apparatus as claimed in claim 1 wherein the adaptive distortion compensator comprises an adaptive predistorter type distortion compensating apparatus.

16. The distortion compensating apparatus as claimed in claim 1 wherein the non-linear distortion circuit comprises a power amplifier.

17. The distortion compensating apparatus as claimed in claim 8 wherein the adaptive equalizing processor changes distance on a row of a filter coefficient between a filter coefficient having a reference in-band gradient and a filter coefficient having a compared in-band gradient, corresponding to a feedback number counted after a start of an algorithm.

18. The distortion compensating apparatus as claimed in claim 9 wherein the adaptive equalizing processor changes distance on a row of a filter coefficient between a filter coefficient having a reference in-band gradient and a filter coefficient having a compared in-band gradient, corresponding to a feedback number counted after a start of an algorithm.

19. The distortion compensating apparatus as claimed in claim 10 wherein the adaptive equalizing processor changes distance on a row of a filter coefficient between a filter coefficient having a reference in-band gradient and a filter coefficient having a compared in-band gradient, corresponding to a feedback number counted after a start of an algorithm.

20. The distortion compensating apparatus as claimed in claim 11 wherein the adaptive equalizing processor changes distance on a row of a filter coefficient between a filter coefficient having a reference in-band gradient and a filter coefficient having a compared in-band gradient, corresponding to a feedback number counted after a start of an algorithm.

21. The distortion compensating apparatus as claimed in claim 12 wherein the adaptive equalizing processor changes distance on a row of a filter coefficient between a filter coefficient having a reference in-band gradient and a filter coefficient having a compared in-band gradient, corresponding to a feedback number counted after a start of an algorithm.

22. The distortion compensating apparatus as claimed in claim 8 wherein the adaptive equalizing processor changes distance on a row of a filter coefficient between a filter coefficient having a reference in-band gradient and a filter coefficient having a compared in-band gradient, corresponding to an average out-of-band power value when the filter coefficient having a reference in-band gradient is applied.

23. The distortion compensating apparatus as claimed in claim 9 wherein the adaptive equalizing processor changes distance on a row of a filter coefficient between a filter coefficient having a reference in-band gradient and a filter coefficient having a compared in-band gradient, corresponding to an average out-of-band power value when the filter coefficient having a reference in-band gradient is applied.

24. The distortion compensating apparatus as claimed in claim 10 wherein the adaptive equalizing processor changes distance on a row of a filter coefficient between a filter coefficient having a reference in-band gradient and a filter coefficient having a compared in-band gradient, corresponding to an average out-of-band power value when the filter coefficient having a reference in-band gradient is applied.

25. The distortion compensating apparatus as claimed in claim 11 wherein the adaptive equalizing processor changes distance on a row of a filter coefficient between a filter coefficient having a reference in-band gradient and a filter coefficient having a compared in-band gradient, corresponding to an average out-of-band power value when the filter coefficient having a reference in-band gradient is applied.

26. The distortion compensating apparatus as claimed in claim 12 wherein the adaptive equalizing processor changes distance on a row of a filter coefficient between a filter coefficient having a reference in-band gradient and a filter coefficient having a compared in-band gradient, corresponding to an average out-of-band power value when the filter coefficient having a reference in-band gradient is applied.

* * * * *